(12) United States Patent
Hamada

(10) Patent No.: US 9,087,727 B2
(45) Date of Patent: Jul. 21, 2015

(54) SEMICONDUCTOR DEVICE

(71) Applicant: PS4 LUXCO S.A.R.L., Luxembourg (LU)

(72) Inventor: Koji Hamada, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 13/795,904

(22) Filed: Mar. 12, 2013

(65) Prior Publication Data
US 2013/0240966 A1    Sep. 19, 2013

(30) Foreign Application Priority Data

Mar. 19, 2012  (JP) .................................. 2012-062404

(51) Int. Cl.
| | | |
|---|---|---|
| H01L 27/108 | (2006.01) | |
| H01L 29/76 | (2006.01) | |
| H01L 29/94 | (2006.01) | |
| H01L 31/119 | (2006.01) | |
| H01L 49/02 | (2006.01) | |

(52) U.S. Cl.
CPC .... *H01L 27/10805* (2013.01); *H01L 27/10817* (2013.01); *H01L 27/10823* (2013.01); *H01L 28/91* (2013.01)

(58) Field of Classification Search
CPC ............ H01L 27/108; H01L 27/10817; H01L 27/10823; H01L 27/10805
USPC .......................................... 257/296, 330, 331
See application file for complete search history.

(56) References Cited

U.S. PATENT DOCUMENTS

| | | | | |
|---|---|---|---|---|
| 7,713,873 | B2* | 5/2010 | Kim et al. ..................... | 438/672 |
| 2011/0143509 | A1 | 6/2011 | Fujimoto | |
| 2012/0012925 | A1* | 1/2012 | Oh ............................... | 257/330 |

FOREIGN PATENT DOCUMENTS

JP    2011-129566    6/2011

* cited by examiner

*Primary Examiner* — Thien F Tran

(57) ABSTRACT

A semiconductor device includes a semiconductor body including a first upper surface with a first side surface extending downwardly therefrom, a second upper surface with a second side surface extending downwardly therefrom, and a bottom surface interfacing first and second side surfaces. The first and second side surfaces and the bottom surface together define a groove. A conductive film partially fills the groove with an intervention of an insulating film therebetween so the conductive film terminates at a first intermediate portion of the first side surface between the first upper surface and the bottom surface and at a second intermediate portion of the second side surface between the second upper surface and the bottom surface. A distance between the first intermediate portion of the first side surface and the first upper surface exceeds a distance between the second intermediate portion of the second side surface and the second upper surface.

16 Claims, 25 Drawing Sheets

DIRECTION OF IMPLANTING IMPURITY IONS

SEMICONDUCTOR DEVICE

This application is based upon and claims the benefit of priority from Japanese patent application No. 2012-062404, filed on Mar. 19, 2012, the disclosure of which is incorporated herein in its entirety by reference.

TECHNICAL FIELD

The present invention relates to a semiconductor device.

BACKGROUND

JP-A 2011-129566 (Patent Literature 1) discloses a structure of dynamic random access memory (DRAM) cells having field effect transistors as selection transistors each having a buried gate electrode structure.

In this technology, a bottom portion of each of grooves formed in a silicon substrate (semiconductor substrate) is filled with a conductive film while an insulation film is interposed between the conductive film and inner surfaces of the groove. In this manner, a metal insulator semiconductor (MIS) structure is formed at the bottom portion of each of the grooves. Source/drain (S/D) regions are drawn from an upper surface of the silicon substrate.

One of the S/D regions is connected to a bit line, and the other S/D region is connected to a capacitor. Thus, a DRAM cell is formed.

Meanwhile, in a buried gate type MIS transistor disclosed in Patent Literature 1, a gate electrode (buried gate electrode) is arranged at the bottom of a groove formed in an active region while a gate insulation film is interposed between the gate electrode and inner surfaces of the groove.

Therefore, when an ON-state voltage is applied to a buried gate electrode, an inversion layer (channel) is formed at a deep location from the same level as an upper surface of the buried gate electrode as seen in the depth direction of the silicon substrate.

Specifically, when a buried gate type MIS transistor is turned on, carriers drift in a semiconductor region from an S/D contact portion on a surface of a silicon substrate (a contact portion between a contact plug and an S/D region) to an upper surface of the buried gate electrode in which a channel is formed.

Therefore, the depth of the gate electrode being buried affects the device characteristics. In this regard, there is a room for improving a structure of a buried gate type MIS transistor.

SUMMARY

In one embodiment, there is provided a semiconductor device including:

a semiconductor body including a first upper surface, a first side surface extending downwardly from the first upper surface, a second upper surface, a second side surface extending downwardly from the second upper surface, and a bottom surface interfacing the first and second side surfaces with each other, the first and second side surfaces and the bottom surface cooperating with one another to define a groove; and a conductive film partially filling the groove with an intervention of an insulating film therebetween such that the conductive film terminates at a first intermediate portion of the first side surface between the first upper surface and the bottom surface and at a second intermediate portion of the second side surface between the second upper surface and the bottom surface, a first distance between the first intermediate portion of the first side surface and the first upper surface being greater than a second distance between the second intermediate portion of the second side surface and the second upper surface.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF EXEMPLARY EMBODIMENTS

The inventor examined variations in characteristic of devices that were affected by differences of the depth measured from a primary surface of a semiconductor substrate to an upper surface of a buried gate electrode when buried gate electrode type MIS transistors were used as selection transistors in a DRAM. The examined example will be described below with reference to FIGS. 17 and 18.

Figure 17:
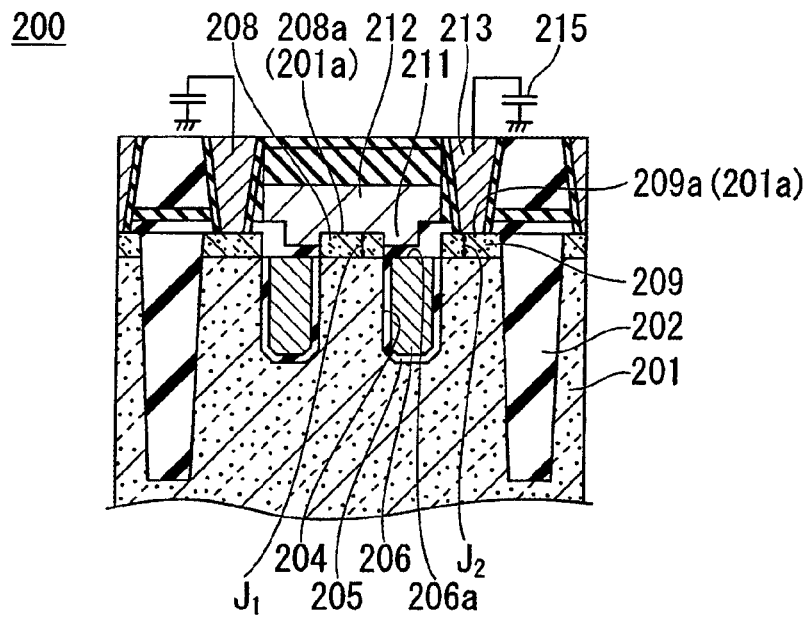
FIG. 17 is a cross-sectional view showing a primary portion of a semiconductor device examined by the inventor.

Referring to FIG. 17, a semiconductor device 200 has two grooves 204 in an active region defined by a device isolation region 202 provided in a semiconductor substrate 201. A buried gate electrode 206 is provided in each of the two grooves 204 while a gate insulation film 205 is interposed between the buried gate electrode 206 and inner surfaces of the groove 204. The buried gate electrode 206 has an upper surface 206a located near a primary surface 201a of the semiconductor substrate 201.

A first impurity diffusion region 208 (source/drain region) is provided on the semiconductor substrate 201 between the two buried gate electrodes 206. The first impurity diffusion region 208 has an upper surface 208a that accords with the primary surface 201a of the semiconductor substrate 201.

The upper surface 208a of the first impurity diffusion region 208 is electrically connected to a bit line 212 via a bit contact plug 211.

Second impurity diffusion regions 209 (source/drain region) are provided on the semiconductor substrate 201 between the buried gate electrodes 206 and the device isolation region 202. Each of the second impurity diffusion regions 209 has an upper surface 209a that accords with the primary surface 201a of the semiconductor substrate 201.

The upper surface 209a of each of the second impurity diffusion regions 209 is connected to a contact plug 213, which is electrically connected to a capacitor 215.

$J_1$ represents the depth of the upper surface 206a of the buried gate electrode 206 from the upper surface 208a of the first impurity diffusion region 208, which is hereinafter referred to as the depth $J_1$. $J_2$ represents the depth of the upper surface 206a of the buried gate electrode 206 from the upper surface 209a of the second impurity diffusion region 209, which is hereinafter referred to as the depth $J_2$.

Figure 18:
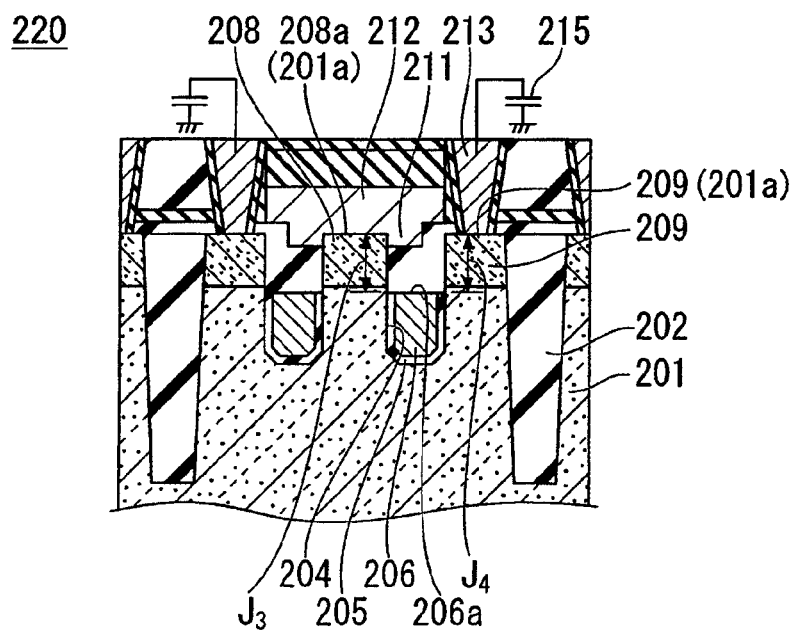
FIG. 18 is a cross-sectional view showing a primary portion of another semiconductor device examined by the inventor.

Referring to FIG. 18, a semiconductor device 220 has the same configuration as the semiconductor device 200 shown in FIG. 17 except that the upper surfaces 206a of the buried gate electrodes 206 are located lower than those shown in FIG. 17.

$J_3$ represents the depth of the upper surface 206a of the buried gate electrode 206 from the upper surface 208a of the first impurity diffusion region 208, which is hereinafter referred to as the depth $J_3$. $J_4$ represents the depth of the upper surface 206a of the buried gate electrode 206 from the upper surface 209a of the second impurity diffusion region 209, which is hereinafter referred to as the depth $J_4$.

As described with reference to FIGS. 17 and 18, a buried gate electrode 206 is provided at the bottom portion of each of grooves 204 formed in an active region of a buried gate type MIS transistor while a gate insulation film 205 is interposed between the buried gate electrode 206 and inner surfaces of the groove 204.

Therefore, when an ON-state voltage is applied to the buried gate electrode 206, an inversion layer (channel) is formed at a deep location from the same level as the upper surface 206a of the buried gate electrode 206 as seen in the depth direction of the semiconductor substrate 201.

Specifically, when the buried gate type MIS transistor is turned on, carriers drift in a semiconductor region (part of the semiconductor substrate 201) from a S/D contact portion on the primary surface 201a of the semiconductor substrate 201 (the upper surfaces 208a and 209a of the first and second impurity diffusion regions 208 and 209) to the upper surface 206a of the buried gate electrode 206.

If the depths $J_1$ and $J_2$ from the upper surface 206a of the buried gate electrode 206 are set to be shallow as in the semiconductor device 200 shown in FIG. 17, the drift distance of carriers becomes short. Therefore, a parasitic resistance component is reduced so that ON-state currents (Ion) are improved. For example, for characteristics of the DRAM, this means that a period of time to write a potential of the bit line 212 into the capacitor 215 (writing time $t_{WR}$) becomes shorter.

Meanwhile, with the structure of the semiconductor device 200 shown in FIG. 17, a contact surface at which the contact plug 213 is held in contact with the upper surface 209a of the second impurity diffusion region 209 is located close to the upper surface 206a of the buried gate electrode 206.

In this manner, if a channel is brought close to a location where electric fields concentrate, such as the contact surface at which the contact plug 213 is held in contact with the upper surface 209a of the second impurity diffusion region 209, that is, if the depth $J_2$ is reduced, then the junction leakage increases. For example, for characteristics of the DRAM, charges stored in the capacitor 215 become likely to be discharged when the selection transistor is turned off. Therefore, a period of time of refreshing (refreshing time $t_{REF}$) becomes shorter.

In contrast, if the depths $J_3$ and $J_4$ of the upper surface 206a of the buried gate electrode 206 are set to be great as in the semiconductor device 220 shown in FIG. 18, a phenomenon opposite to the phenomenon described with reference to FIG. 17 improves the $t_{REF}$ characteristics and deteriorates the $t_{WR}$ characteristics.

In this manner, the inventor has found that there is a trade-off between the $t_{REF}$ characteristics and the $t_{WR}$ characteristics when the depth of the buried gate electrode 206 is uniformly changed in selection transistors of memory cells in a DRAM having a buried gate electrode structure.

The present invention will be now described herein with reference to illustrative exemplary embodiments. Those skilled in the art will recognize that many alternative embodiments can be accomplished using the teachings of the present invention and that the invention is not limited to the exemplary embodiments illustrated for explanatory purposes.

Exemplary embodiments of the invention will be described in detail with reference to the drawings.

First Exemplary Embodiment

Figure 1:
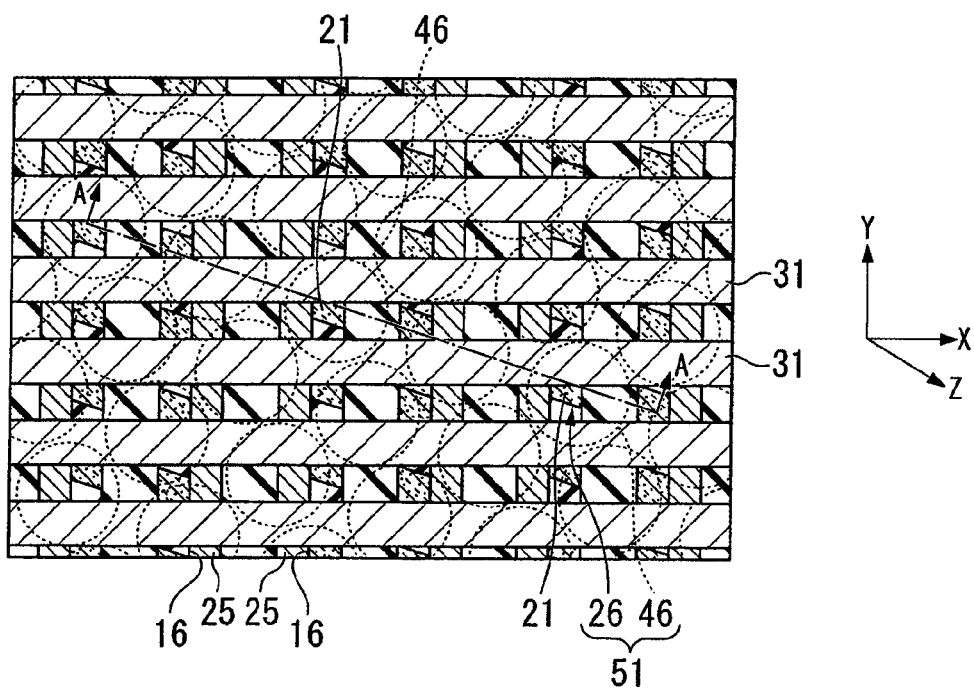
FIG. 1 is a plan view showing an outlined structure of a memory cell array of a semiconductor device according to a first embodiment of the present invention.

FIG. 1 is a plan view showing an outlined structure of a memory cell array in a semiconductor device according to a first embodiment of the present invention. FIG. 1 is used to explain directions in which gate electrodes 25 and bit lines 31 extend, positions of second impurity diffusion regions 21, and a layout of capacitors 46.

Figure 2:
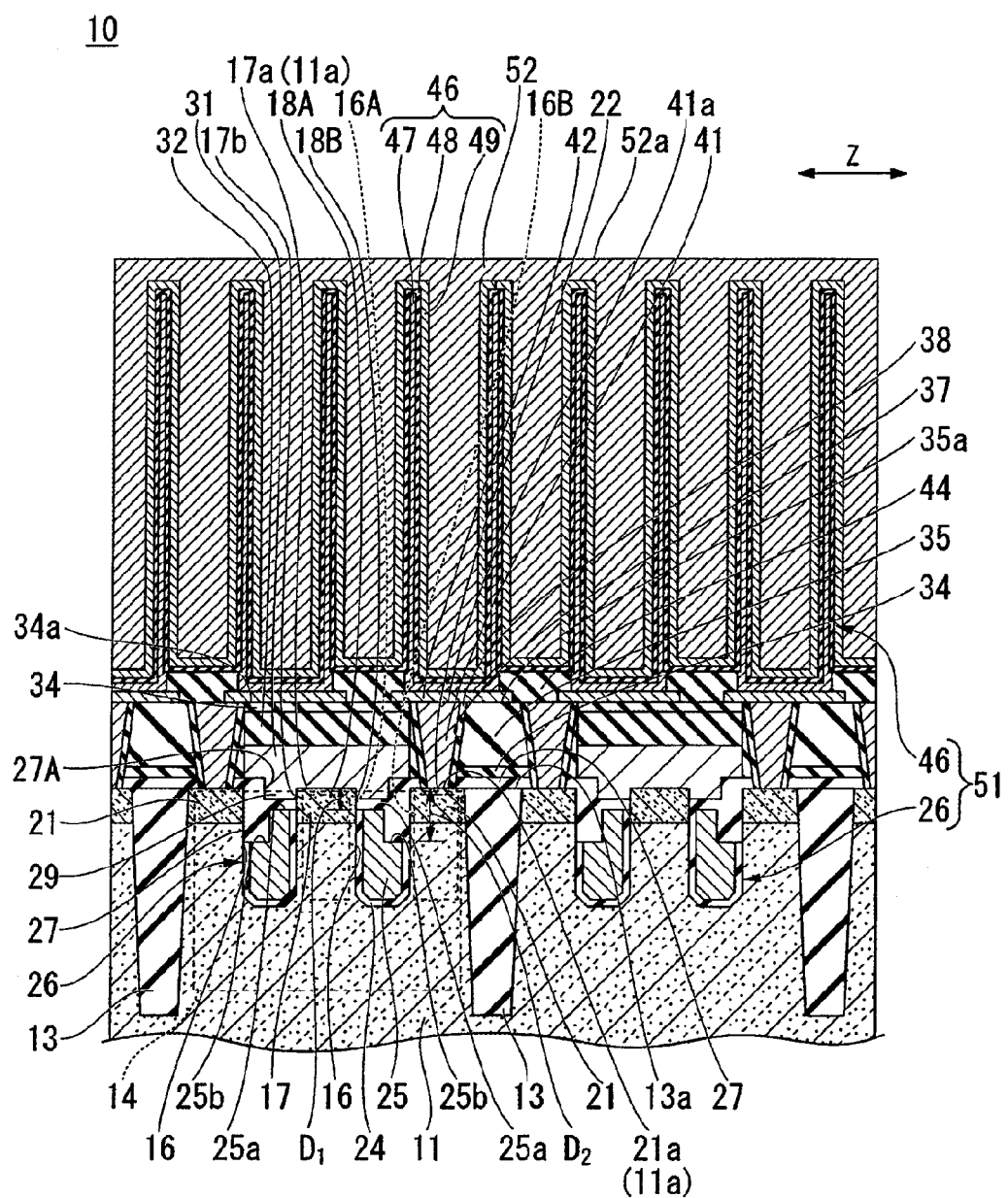
FIG. 2 is a cross-sectional view of the semiconductor device taken along line A-A of FIG. 1.

FIG. 1 only illustrates the gate electrodes 25, the bit lines 31, the second impurity diffusion regions 21, and the capacitors 46 among components of a semiconductor device 10 according to a first embodiment of the present invention. FIG. 2 is a cross-sectional view of the semiconductor device taken along line A-A of FIG. 1.

In FIG. 1, the X-direction represents a direction in which the bit lines 31 extend, the Y-direction represents a direction in which the gate electrodes 25 extend, and the Z-direction represents a direction in which active regions 14 extend (a longitudinal direction of the active regions 14). The Y-direction is perpendicular to the X-direction.

In FIG. 2, the same components of the semiconductor device 10 as illustrated in FIG. 1 are denoted by the same reference numerals. In the first embodiment, a DRAM will be described as an example of the semiconductor device 10.

The semiconductor device 10 (memory cell array) according to the first embodiment of the present invention will be described with reference to FIGS. 1 and 2. The semiconductor device 10 has a peripheral circuit area (including transistors for peripheral circuits and the like) that is arranged so as to surround a memory cell region. Such a peripheral circuit area is not illustrated in FIG. 1 or 2.

Referring to FIG. 2, the semiconductor device 10 according to the first embodiment has a semiconductor substrate 11, a device isolation region 13, grooves 16, first impurity diffusion regions 17, second impurity diffusion regions 21, gate insulation films 24, gate electrodes 25 (buried gate type electrodes), selection transistors 26, interlayer dielectric films 27 for bit contact, bit contact plugs 29, bit lines 31 (conductive wires), cap insulation films 32, liner films 34, interlayer dielectric films 35 for capacitance contact, contact holes 37, sidewall films 38, capacitance contact plugs 41, capacitance contact pads 42, silicon nitride films 44, capacitors 46, memory cells 51, and a capacitance plate 52.

The semiconductor substrate 11 is in the form of a plate. For example, a p-type monocrystalline silicon substrate may be used as the semiconductor substrate 11. The first embodiment describes an example in which a p-type monocrystalline silicon substrate is used as the semiconductor substrate 11.

The device isolation region 13 is formed in the primary surface 11a of the semiconductor substrate 11. The device isolation region 13 has portions extending along the Y-direction as illustrated in FIG. 1 and portions extending along the Z-direction as illustrated in FIG. 1. Thus, the device isolation region 13 defines a plurality of active regions 14 that extend along the Z-direction. In other words, each of the active regions 14 has a longitudinal direction extending along the Z-direction.

The device isolation region 13 has a structure including device isolation grooves formed in the semiconductor substrate 11 and an insulation film filled in the device isolation grooves, such as a silicon oxide film ($SiO_2$ film) or a silicon nitride film (SiN film).

Furthermore, the device isolation region 13 has an upper surface 13a that is flat and flush with the primary surface 11a of the semiconductor substrate 11.

Referring to FIGS. 1 and 2, the grooves 16 are formed in the primary surface 11a of the semiconductor substrate 11 so as to extend along the Y-direction. Each of the grooves 16 extends across a plurality of active regions 14 arranged in the Y-direction.

Two grooves 16 are arranged in one active region 14. The grooves 16 are formed by digging the primary surface 11a of the semiconductor substrate 11 in the depth direction of the semiconductor substrate 11.

Furthermore, the depth of the grooves 16 measured from the primary surface 11a of the semiconductor substrate 11 is set to be shallower than the depth of the grooves of the device isolation region 13.

Referring to FIG. 2, the first impurity diffusion regions 17 serve as source/drain regions. Each of the first impurity diffusion regions 17 is provided underneath the primary surface 11a of the semiconductor substrate 11 on a first lateral portion 16A of a groove 16 that is located on a first side of the groove 16 in the semiconductor substrate 11.

Each of the first impurity diffusion regions 17 is a semiconductor region electrically connected to the corresponding bit contact plug 29 (first conductor) and has a conductivity type inverse to the conductivity type of the semiconductor substrate 11. In the first embodiment, the first impurity diffusion regions 17 have an n-type conductivity.

Each of the first impurity diffusion regions 17 is provided in the semiconductor substrate 11 between two grooves 16.

In the first embodiment, the first lateral portion 16A of a groove 16 refers to a portion of the semiconductor substrate 11 that is located between two grooves 16 in an active region 14.

Each of the first impurity diffusion regions 17 has an upper surface 17a that accords with the primary surface 11a of the semiconductor substrate 11 and sidewall surfaces 17b exposed from the interlayer dielectric film 27 for bit contact. The upper surface 17a and the sidewall surfaces 17b of the first impurity diffusion region 17 are held in contact with the corresponding bit contact plug 29.

Thus, a first contact portion 18A (bit contact) is formed between the upper surface 17a of the first impurity diffusion region 17 and the bit contact plug 29, and a second contact portion 18B (bit contact) is formed between the sidewall surfaces 17b of the first impurity diffusion region 17 and the bit contact plug 29.

The second impurity diffusion regions 21 serve as source/drain regions. Each of the second impurity diffusion regions 21 is provided underneath the primary surface 11a of the semiconductor substrate 11 on a second lateral portion 16B of a groove 16 that is located on a second side of the groove 16 in the semiconductor substrate 11.

Each of the second impurity diffusion regions 21 is a semiconductor region electrically connected to the capacitance contact plug 41 (second conductor) and has a conductivity type inverse to the conductivity type of the semiconductor substrate 11. In the first embodiment, the second impurity diffusion regions 21 have an n-type conductivity.

The second impurity diffusion regions 21 are provided in the semiconductor substrate 11 between a portion of the device isolation region 13 that extends along the Y-direction and the grooves 16.

In the first embodiment, the second lateral portion 16B of a groove 16 refers to a portion of the semiconductor substrate 11 that is located in an active region 14 between a portion of the device isolation region 13 that extends along the Y-direction and the groove 16.

Each of the second impurity diffusion regions 21 has an upper surface 21a that accords with the primary surface 11a of the semiconductor substrate 11. The upper surfaces 21a of the second impurity diffusion regions 21 are located on a plane passing through the upper surfaces 17a of the first impurity diffusion regions 17. That is, the upper surfaces 21a of the second impurity diffusion regions 21 are located at the same height as the upper surfaces 17a of the first impurity diffusion regions 17.

In other words, the upper surfaces 17a of the first impurity diffusion regions 17 (the primary surface 11a of the semiconductor substrate 11 on the first lateral portions 16A) and the upper surfaces 21a of the second impurity diffusion regions 21 (the primary surface 11a of the semiconductor substrate 11 on the second lateral portions 16B) are located on the same plane.

The upper surface 21a of each of the second impurity diffusion regions 21 is held in contact with the capacitance contact plug 41 electrically connected to the capacitor 46. Thus, a third contact portion 22 (capacitance contact) is formed between the upper surface 21a of the second impurity diffusion region 21 and the capacitance contact plug 41.

Each of the gate insulation films 24 is provided so as to cover a portion of inner surfaces of the groove 16 that corresponds to an area in which the gate electrode 25 is to be formed. For example, a silicon oxide film ($SiO_2$ film) may be used for the gate insulation film 24.

Each of the gate electrodes 25 is disposed within the groove 16 while the gate insulation film is interposed between the gate electrode 25 and the inner surfaces of the groove 16. Each of the gate electrodes 25 has upper surfaces 25a and 25b having different heights, so that a step is formed by the upper surfaces 25a and 25b of the gate electrode 25.

The upper surface 25a of the gate electrode 25 is located near an upper portion of the first lateral portion 16A of the groove 16 (on the bit contact side). The upper surface 25b of the gate electrode 25 is located near an upper portion of the second lateral portion 16B of the groove 16 (on the capacitance contact side).

Each of the gate electrodes 25 is shared among a plurality of selection transistors 26 (field effect transistors).

The depth $D_2$ of the upper surface 25b of the gate electrode 25 from the upper surface 21a of the second impurity diffusion region 21 (the primary surface 11a of the semiconductor substrate 11) is set to be greater than the depth $D_1$ of the upper surface 25a of the gate electrode 25 from the upper surface 17a of the first impurity diffusion region 17 (the primary surface 11a of the semiconductor substrate 11).

In other words, also as recited in claim 1, the semiconductor device has a semiconductor body including a first upper surface, a first side surface extending downwardly from the first upper surface, a second upper surface, a second side surface extending downwardly from the second upper surface, and a bottom surface interfacing the first and second side surfaces with each other. The first and second side surfaces and the bottom surface cooperate with one another to define a groove.

A conductive film partially fills the groove with an intervention of an insulating film therebetween such that the conductive film terminates at a first intermediate portion of the first side surface between the first upper surface and the bottom surface and at a second intermediate portion of the second side surface between the second upper surface and the bottom surface.

A first distance between the first intermediate portion of the first side surface and the first upper surface is greater than a second distance between the second intermediate portion of the second side surface and the second upper surface.

Thus, distances from contact surfaces between contact plugs and the substrate to the channel region can be made asymmetric between the source region and the drain region in a buried gate electrode type field effect transistor. Therefore, the flexibility of controlling the transistor characteristics can be improved.

More specifically, since the third contact portion 22 (contact interface) is located away from a channel, junction leakage due to concentration of electric fields is reduced in the third contact portion 22. On the other hand, since the first and second contact portions 18A and 18B (contact interfaces) are located near the channel, a parasitic resistance is reduced in the first and second contact portions 18A and 18B when the transistor is turned on.

For example, when such transistors are used for selection transistors of memory cells 51 in a DRAM, ON-state currents (Ion) of the selection transistors 26 can be improved without deteriorating the data holding property of the capacitors 46. Thus, the $t_{WR}$ characteristics can be improved while the $t_{REF}$ characteristics are maintained. In other words, the flexibility of controlling the transistor characteristics can be improved.

Figure 7A:
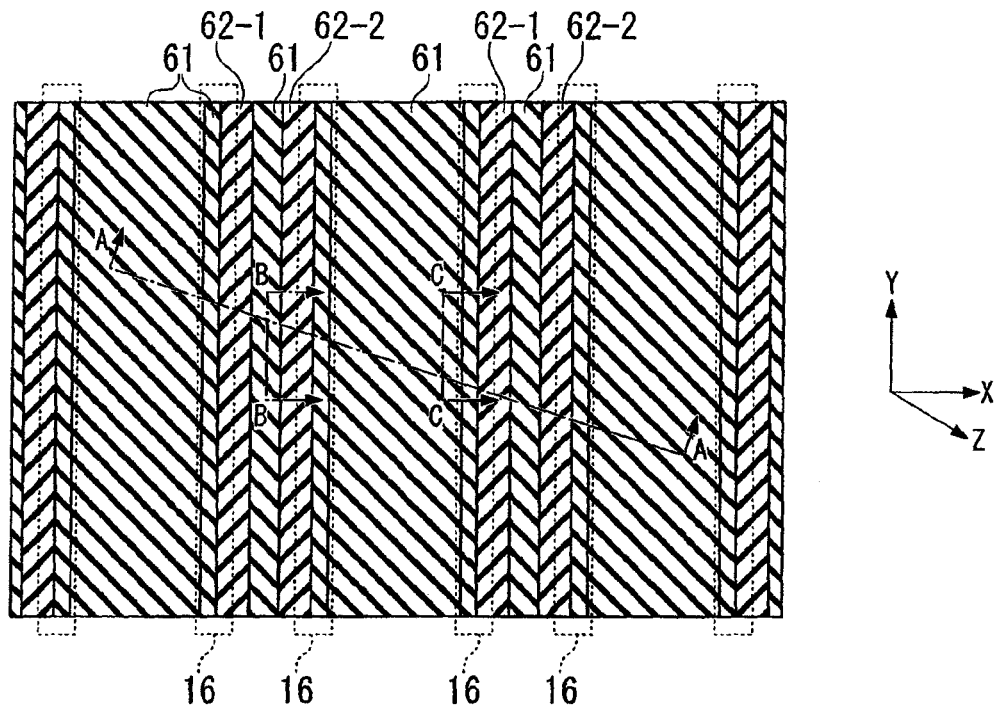
FIG. 7A is a plan view showing a manufacturing step following the manufacturing step illustrated in FIG. 6A.

Referring to FIG. 1, the gate electrodes 25 extend along the Y-direction. Furthermore, as shown in FIG. 7A, which will be described later, a plurality of active regions 14 are arranged in the Y-direction while each of the active regions 14 has a longitudinal direction extending along the Z-direction. Each of the gate electrodes 25 extends across a plurality of active regions 14 arranged in the Y-direction. Thus, each of the gate electrodes 25 is shared among a plurality of selection transistors 26.

Each of the selection transistors 26 is a field effect transistor and has a groove 16, a gate insulation film 24, a gate electrode 25, a first impurity diffusion region 17, and a second impurity diffusion region 21. A plurality of selection transistors 26 are provided in the semiconductor device 10. Two selection transistors 26 are provided in one active region 14.

The interlayer dielectric films 27 for bit contact are provided on the upper surfaces 13a of the device isolation region 13 and part of the upper surfaces 21a of the second impurity diffusion regions 21 so that the grooves 16 in which the gate insulation film 24 and the gate electrode 25 have been provided are filled with the interlayer dielectric films 27.

A portion of the interlayer dielectric film 27 for bit contact that is located in the groove 16 serves as a buried insulation film and covers the upper surfaces 25a and 25b of the gate electrode 25, which form a step.

The interlayer dielectric films 27 for bit contact have bit contact openings 27A. Each of the bit contact openings 27A exposes the upper surface 17a of the first impurity diffusion region 17, in which the first contact portion 18A is formed, and the sidewall surfaces 17b of the first impurity diffusion region 17, in which the second contact portion 18B is formed.

Each of the bit contact plugs 29 (first conductor) is provided so that the bit contact opening 27A is filled with the bit contact plug 29. Thus, the bit contact plug 29 is held in contact with the upper surface 17a and the sidewall surfaces 17b of the first impurity diffusion region 17.

Each of the bit contact plugs 29 is arranged in contact with the upper surface 17a of the first impurity diffusion region 17 (the primary surface 11a of the semiconductor substrate 11) located at the upper portion of the first lateral portion 16A of the groove 16. Each of the bit contact plugs 29 is electrically connected to the corresponding bit line 31.

The bit contact plugs 29 are conductors primarily including a polycrystalline silicon film (doped polysilicon film) in which impurities having a conductivity type (n-type in the first embodiment) that is inverse to the conductivity type (p-type in the first embodiment) of the semiconductor substrate 11 have been doped.

Each of the bit lines 31 (conductive wires) is provided on the bit contact plug 29 and the interlayer dielectric film 27 for bit contact and is formed integrally with the bit contact plug 29.

Each of the bit lines 31 is electrically connected to the bit contact plug 29 and is shared among a plurality of selection transistors 26 (field effect transistors).

As shown in FIG. 1, the bit lines 31 extend along the X-direction. A plurality of bit lines 31 are arranged in the Y-direction with predetermined intervals. The bit lines 31 extend perpendicular to the gate electrodes 25.

Referring to FIG. 2, each of the cap insulation films 32 is provided so as to cover the upper surface of the corresponding bit line 31. Each of the cap insulation films 32 has a function of protecting the upper surface of the bit line 31 and a function of an etching mask used for anisotropic etching of a conductive film, which will form the bit lines 31. A silicon nitride film (SiN film) may be used for the cap insulation films 32.

Each of the liner films 34 is provided so as to cover sidewalls of the bit line 31, an upper surface and sidewalls of the cap insulation film 32, and an upper surface of the interlayer dielectric film 27 for bit contact that is formed on the upper surface 13a of the device isolation region 13 and the upper surface 21a of the second impurity diffusion region 21.

Part of the liner film 34 that is provided on the sidewalls of the bit line 31 has a function of protecting the sidewalls of the bit line 31. A silicon nitride film (SiN film) may be used for the liner films 34.

Each of the interlayer dielectric films 35 for capacitance contact is provided so as to cover an upper surface of the corresponding liner film 34 located above the device isolation region 13 and the second impurity diffusion region 21. Each of the interlayer dielectric films 35 for capacitance contact has an upper surface 35a that is flat and flush with the upper surfaces 34a of the liner films 34 located above the cap insulation films 32.

For example, a coating type insulation film (an insulation film made of a material such as polysilazane) may be used as the interlayer dielectric films 35 for capacitance contact.

Each of the contact holes 37 is formed so as to extend through the interlayer dielectric film 27 for bit contact, the liner film 34, and the interlayer dielectric film 35 for capacitance contact that are stacked on the second impurity diffusion region 21. Each of the contact holes 37 exposes the upper surface 21a of the second impurity diffusion region 21 and the liner film 34 provided on the sidewalls of the bit line 32 and the sidewalls of the cap insulation film 32.

The sidewall films 38 are provided so as to cover sidewalls of the contact holes 37 (more specifically, the surfaces of the liner films 34 exposed by the contact holes 37, the sidewalls of the interlayer dielectric films 27 for bit contact, the sidewalls of the liner films 34, and the sidewalls of the interlayer dielectric films 35 for capacitance contact).

Each of the capacitance contact plugs 41 is provided so that the contact hole 37 is filled with the capacitance contact plug 41 while the sidewall film 38 is interposed between the capacitance contact plug 41 and inner surfaces of the contact hole 37. Thus, each of the capacitance contact plugs 41 has a lower end held in contact with the upper surface 21a of the second impurity diffusion region 21.

Each of the capacitance contact plugs 41 has an upper surface 41a that is flush with the upper surface 35a of the interlayer dielectric film 35 for capacitance contact.

Each of the capacitance contact plugs 41 (second conductors) is arranged in contact with the upper surface 21a of the second impurity diffusion region 21 (the primary surface 11a of the semiconductor substrate 11) that is located at the upper portion of the second lateral portion 16B of the groove 16.

Each of the capacitance contact plugs 41 is electrically connected to the corresponding capacitor 46 via the capacitance contact pad 42.

The capacitance contact plugs 41 are conductors primarily including a polycrystalline silicon film (doped polysilicon film) in which impurities having a conductivity type (n-type in the first embodiment) that is inverse to the conductivity type (p-type in the first embodiment) of the semiconductor substrate 11 have been doped.

Each of the capacitance contact pads 42 has a circular shape. Each of the capacitance contact pads 42 is arranged on the upper surface 34a of the liner film 34 or the upper surface 35a of the interlayer dielectric film 35 for capacitance contact such that the capacitance contact pad 42 is held in contact with at least part of the upper surface 41a of the capacitance contact plug 41.

One capacitance contact pad 42 is provided for each of the capacitance contact plugs 41.

The silicon nitride films 44 are provided on the upper surfaces 34a of the liner films 34, the upper surfaces 35a of the interlayer dielectric films 35 for capacitance contact, and the upper surfaces 41a of the capacitance contact plugs 41 such that peripheries of the capacitance contact pads 42 are surrounded by the silicon nitride films 44.

One capacitor 46 is provided for each of the capacitance contact pads 42. Each of the capacitors 46 is electrically connected to the corresponding capacitance contact plug 41. The individual selection transistors 26 (field effect transistors) have capacitors 46, separately.

Each of the capacitors 46 includes one lower electrode 47, a capacitance insulation film 48, which is common to a plurality of lower electrodes 47, and an upper electrode 49, which is common to a plurality of lower electrodes 47.

Each of the lower electrodes 47 is in the form of a crown and is formed on the corresponding capacitance contact pad 42. Each of the lower electrodes 47 is electrically connected to the corresponding second impurity diffusion region 21 via the capacitance contact pad 42.

The capacitance insulation film 48 is formed so as to cover surfaces of the lower electrodes 47 exposed from the silicon nitride films 44 and upper surfaces of the silicon nitride films 44.

The upper electrode 49 is formed so as to cover a surface of the capacitance insulation film 48.

Referring to FIGS. 1 and 2, each of the memory cells 51 includes one selection transistor 26 and one capacitor 46. A plurality of memory cells 51 are provided in a memory cell region.

Referring to FIG. 2, the capacitance plate 52 is formed so as to fill the interiors of the lower electrodes 47 on which the capacitance insulation film 48 and the upper electrode 49 are formed and gaps between adjacent lower electrodes 47. The capacitance plate 52 has an upper surface 52a that is flat and is located above the upper electrode 49.

The semiconductor device 10 may include an interlayer dielectric film (not shown) formed on the upper surface 52a of the capacitance plate 52, contact plugs (not shown) formed within the interlayer dielectric film and connected to the upper electrode 49, and wires (not shown) formed on the interlayer dielectric film and connected to those contact plugs, which are not illustrated in FIG. 2.

According to a semiconductor device of the first embodiment, the upper surface 17a of the first impurity diffusion region 17 (the primary surface 11a of the semiconductor substrate 11 at the first lateral portion 16A) and the upper surface 21a of the second impurity diffusion region 21 (the primary surface 11a of the semiconductor substrate 11 at the second lateral portion 16B) are arranged on the same plane. Furthermore, the depth $D_2$ of the upper surface 25b of each of the gate electrodes 25 from the upper surface 21a of the second impurity diffusion region 21 is set to be greater than the depth $D_1$ of the upper surface 25a of the gate electrode 25 from the upper surface 17a of the first impurity diffusion region 17. Since each of the third contact portions 22 (contact interfaces) is located away from the channel on the capacitance contact side, junction leakage due to concentration of electric fields is reduced. Since the first and second contact portions 18A and 18B (contact interfaces) are located close to the channel on the bit contact side, the parasitic resistance is reduced when the transistor is turned on.

In other words, ON-state currents (Ion) of the selection transistors 26 can be improved without deteriorating the data holding property of the capacitors 46. Thus, trade-off improvements of properties can be achieved concurrently.

Specifically, the following advantages are brought by applying the gate electrodes 25 having a structure described in the first embodiment to selection transistors of a DRAM. The $t_{REF}$ characteristics can be maintained by increasing the depth $D_2$ of the upper surface 25b of the gate electrode 25 on the capacitance contact side, where charges stored in a capacitor may possibly leak due to junction leakage. The $t_{WR}$ characteristics can be improved by reducing the depth $D_1$ of the upper surface 25a of the gate electrode 25 on the bit contact side, where no problem of leakage of charges arises.

Next, a method of manufacturing a semiconductor device 10 according to the first embodiment of the present invention will be described below with reference to FIGS. 3A to 12B.

In a first step illustrated in FIGS. 3A to 3D, a monocrystalline silicon substrate with p-type conductivity is prepared as a semiconductor substrate 11. Then a device isolation region 13 is formed by using a well-known technique (e.g., a shallow trench isolation (STI) method). The device isolation region 13 has portions extending along the Y-direction and portions extending along the Z-direction. The device isolation region 13 has an upper surface 13a that is flush with a primary surface 11a of the semiconductor substrate 11. In this manner, a plurality of active regions 14 are defined so that each of the active regions 14 has a longitudinal direction extending along the Z-direction.

Specifically, the device isolation region 13 is formed as follows: The primary surface 11a of the semiconductor substrate 11 is etched to form device isolation grooves. Then those device isolation grooves are filled with an insulation film (e.g., a silicon oxide film ($SiO_2$ film), a silicon nitride film (SiN film), or the like).

Subsequently, the primary surface 11a of the semiconductor substrate 11 (in the active regions 14) are doped with impurities having a conductivity type (n-type in this example) that is inverse to the conductivity type (p-type in this example) of the semiconductor substrate 11 by ion implantation. In this manner, low-concentration impurity diffusion regions 56 are formed in the active regions 14.

At that time, the dose may be set to be $1 \times 10^{17}/cm^3$ to $5 \times 10^{18}/cm^3$, for example. The depth $D_3$ and the concentration of the low-concentration impurity diffusion regions 56 may be properly selected depending upon the purpose of use.

In a step illustrated in FIGS. 4A to 4D, which will be described later, each of the low-concentration impurity diffusion regions 56 in the active region 14 is separated into three regions including one first impurity diffusion region 17 and two second impurity diffusion regions 21.

In a subsequent step illustrated in FIGS. 4A to 4D, an etching mask 57 is formed on the primary surface 11a of the semiconductor substrate 11. The etching mask 57 has opening grooves 57A extending along the Y-direction.

Specifically, a silicon nitride film (SiN film), which is a base material of the etching mask 57, is deposited on the primary surface 11a of the semiconductor substrate 11. Then opening grooves 57A are formed by photolithography technology and dry etching technology. Thus, an etching mask 57 is formed.

Figure 3A:
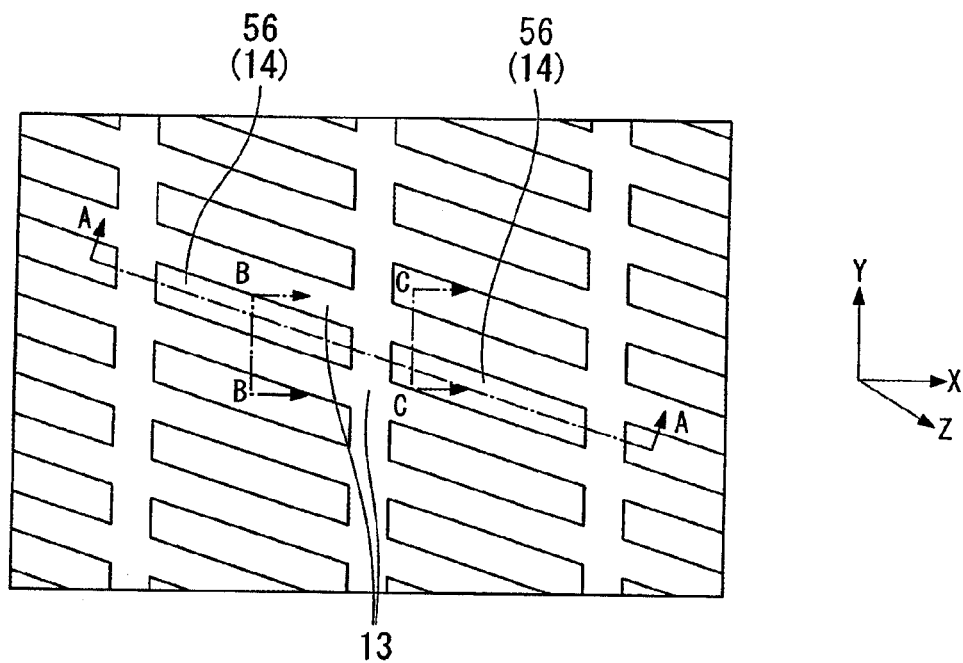
FIG. 3A is a plan view showing a manufacturing step of a memory cell array provided in the semiconductor device according to the first embodiment of the present invention.
Figure 3B:
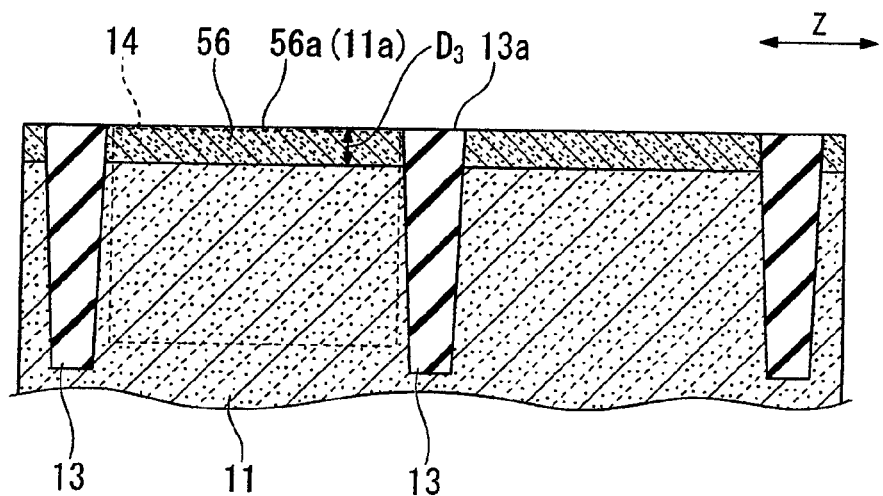
FIG. 3B is a cross-sectional view showing a primary portion of the memory cell array taken along line A-A of FIG. 3A.
Figure 3C:
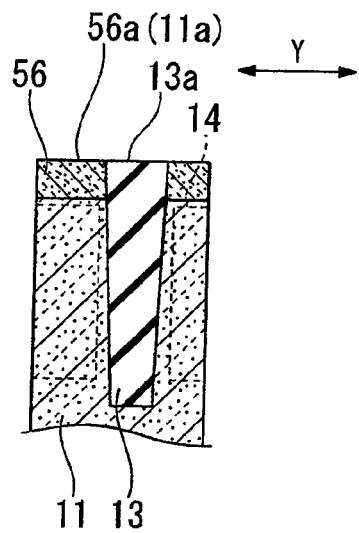
FIG. 3C is a cross-sectional view showing a primary portion of the memory cell array taken along line B-B of FIG. 3A.
Figure 3D:
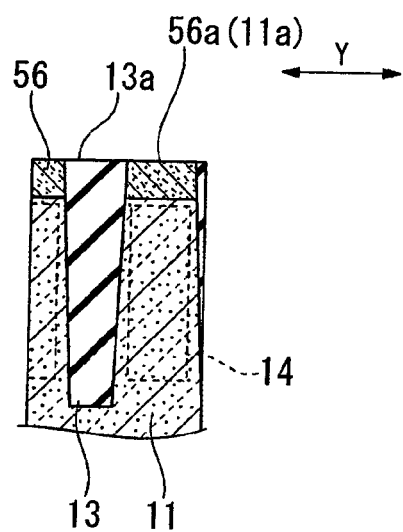
FIG. 3D is a cross-sectional view showing a primary portion of the memory cell array taken along line C-C of FIG. 3A.

At that time, the opening grooves 57A are formed so as to expose a plurality of active regions 14 (the low-concentration impurity diffusion regions 56) arranged in the Y-direction as shown in FIG. 3A. Two opening grooves 57A are formed in one active region 14.

Thereafter, part of the primary surface 11a of the semiconductor substrate 11 that is exposed by the opening grooves 57A is dug in the depth direction by anisotropic dry etching with the etching mask 57. Thus, grooves 16 are formed.

At that time, the grooves 16 are formed so that the depth of the grooves 16 from the primary surface 11a of the semiconductor substrate 11 is shallower than the depth of the device isolation region 13.

Two grooves 16 are formed in one active region 14 (see FIG. 3A). Those two grooves 16 divide one low-concentration impurity diffusion region 56 (see FIG. 3A) into three regions.

In this manner, a first impurity diffusion region 17 that is made of the low-concentration impurity diffusion region 56 and located at the upper portion of the first lateral portion 16A of the groove 16 is formed on the primary surface 11a of the semiconductor substrate 11. A second impurity diffusion region 21 that is made of the low-concentration impurity diffusion region 56 and located at the upper portion of the second lateral portion 16B of the groove 16 is formed on the primary surface 11a of the semiconductor substrate 11.

In other words, a first impurity diffusion region 17 is formed in a portion of the primary surface 11a of the semiconductor substrate 11 that is located between two grooves 16. A second impurity diffusion region 21 is formed in a portion of the primary surface 11a of the semiconductor substrate 11 that is located between the groove 16 and the device isolation region 13.

Upper surfaces 17a and 21a of the first and second impurity diffusion regions 17 and 21 are arranged on the same plane. The upper surfaces 17a and 21a of the first and second impurity diffusion regions 17 and 21 accord with the primary surface 11a of the semiconductor substrate 11. The first and second impurity diffusion regions 17 and 21 serve as source/drain regions.

Then a gate insulation film 24 is formed on portions of inner surfaces of the grooves 16 that correspond to areas in which the gate electrodes 25 illustrated in FIG. 2 are to be formed.

Subsequently, a conductive film 59 (a base material of the gate electrodes 25) is deposited in the grooves 16 while the gate insulation film 24 is interposed between the conductive film 59 and the inner surfaces of the grooves 16. The conductive film 59 has such a thickness that the grooves 16 and the opening grooves 57A are filled with the conductive film 59.

Thereafter, an etching-back process is performed on the conductive film 59, so that the conductive film 59 has flattened upper surfaces 59a that are located lower than the primary surface 11a of the semiconductor substrate 11 (the upper surfaces 17a and 21a of the first and second impurity diffusion regions 17 and 21).

At that time, the etching-back process is performed such that the depth $D_1$ of the upper surface 59a of the conductive film 59 from the upper surfaces 17a of the first impurity diffusion regions 17 is equal to the depth $D_4$ of the upper surface 59a of the conductive film 59 from the upper surfaces 21a of the second impurity diffusion regions 21.

Furthermore, the upper surface 59a of the conductive film 59 is located at a position lower than the position of an upper surface 57a of the etching mask 57. Therefore, groove portions 60 are formed between the upper surface 57a of the etching mask 57 and the upper surface 59a of the conductive film 59. The bottoms of the groove portions 60 are formed by the upper surface 59a of the conductive film 59. Each of the groove portions 60 extends along the Y-direction.

Since the upper surface 59a of the conductive film 59 is located at a position lower than the positions of the upper surfaces 17a and 21a of the first and second impurity diffusion regions 17 and 21, the groove portions 60 expose part of side surfaces of the first and second impurity diffusion regions 17 and 21 (sidewalls of the upper portions of the first lateral portions 16A and sidewalls of the upper portions of the second lateral portions 16B).

Then, a protective film 61 is formed so as to cover the surface of the etching mask 57 and inner surfaces of the groove portions 60 (including the flattened upper surface 59a of the conductive film 59). The protective film 61 has such a thickness that the opening grooves 57A are not fully filled with the protective film 61. Thus, part of side surfaces of the first and second impurity diffusion regions 17 and 21 exposed by the groove portions 60 is covered with the protective film 61. Specifically, the protective film 61 is formed by depositing a silicon nitride film, for example.

Subsequently, an amorphous silicon film 62 is stacked on a surface 61a of the protective film 61. The amorphous silicon film 62 has such a thickness that the opening grooves 57A are not fully filled with the amorphous silicon film 62. Thus, the inner surfaces of the groove portions 60 are covered with the amorphous silicon film 62 while the protective film 61 is interposed between the amorphous silicon film 62 and the inner surfaces of the groove portions 60.

In a subsequent step illustrated in FIGS. 5A to 5D, a photoresist film 65 having opening grooves 65A formed therein is formed on the amorphous silicon film 62. Each of the opening grooves 65A of the photoresist film 65 exposes a first one of two groove portions 60 (the left one of two groove portions 60 in FIG. 5B).

At that time, the opening grooves 65A are formed so as to have a width greater than the width of the groove portions 60. Thus, part of the amorphous silicon film 62 that has been formed on the inner surfaces of the groove portions 60 and part of the amorphous silicon film 62 that has been located on both sides of upper portions of the groove portions 60 and located above the etching mask 57 are exposed from the photoresist film 65.

Figure 4A:
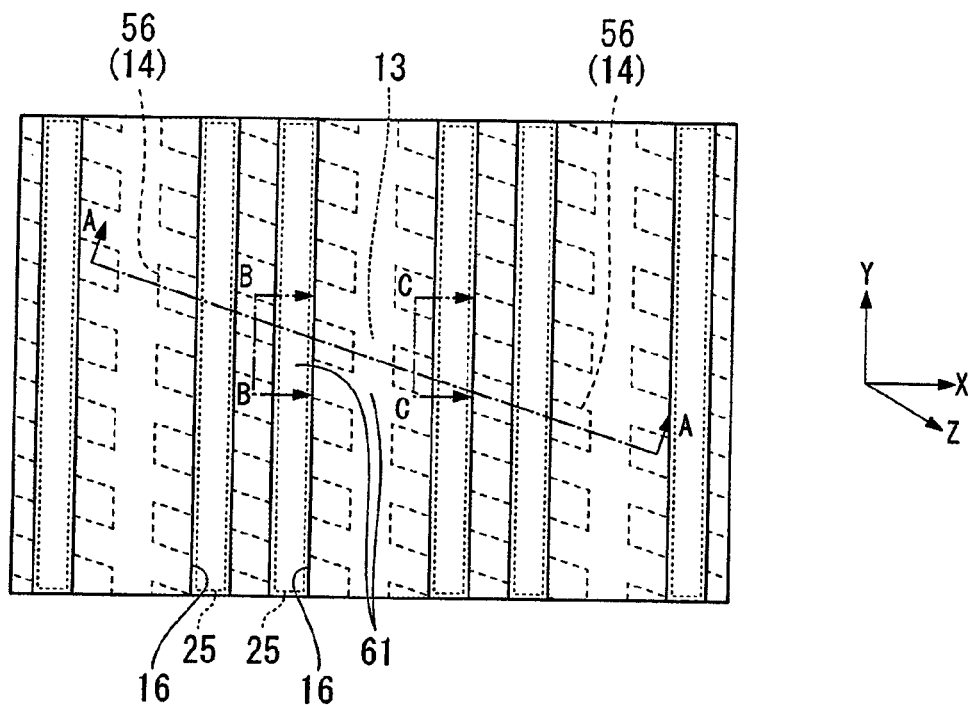
FIG. 4A is a plan view showing a manufacturing step following the manufacturing step illustrated in FIG. 3A.
Figure 4B:
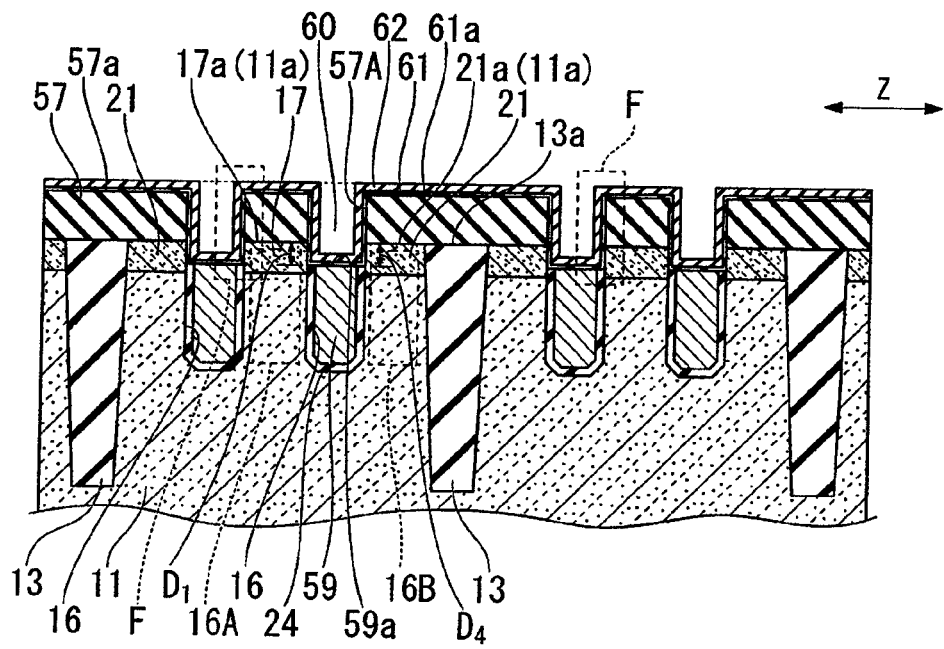
FIG. 4B is a cross-sectional view showing a primary portion of the memory cell array taken along line A-A of FIG. 4A.
Figure 4C:
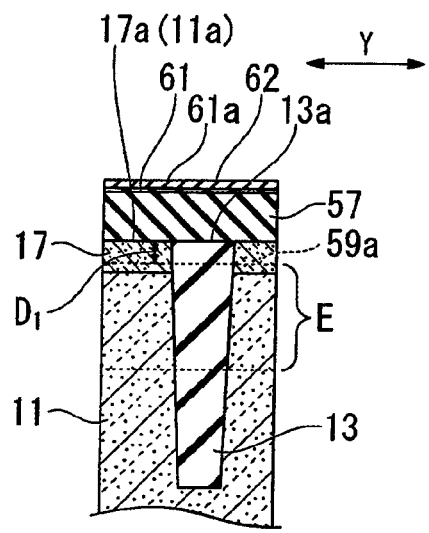
FIG. 4C is a cross-sectional view showing a primary portion of the memory cell array taken along line B-B of FIG. 4A.
Figure 4D:
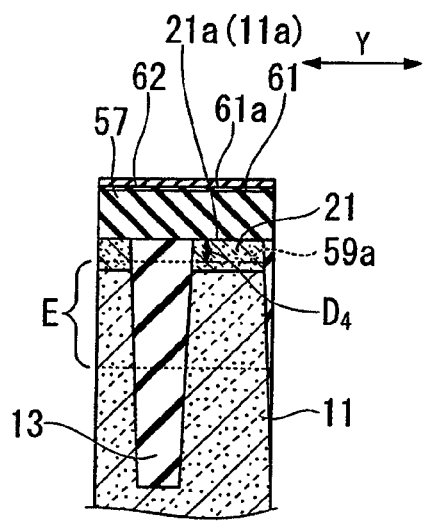
FIG. 4D is a cross-sectional view showing a primary portion of the memory cell array taken along line C-C of FIG. 4A.
Figure 5A:
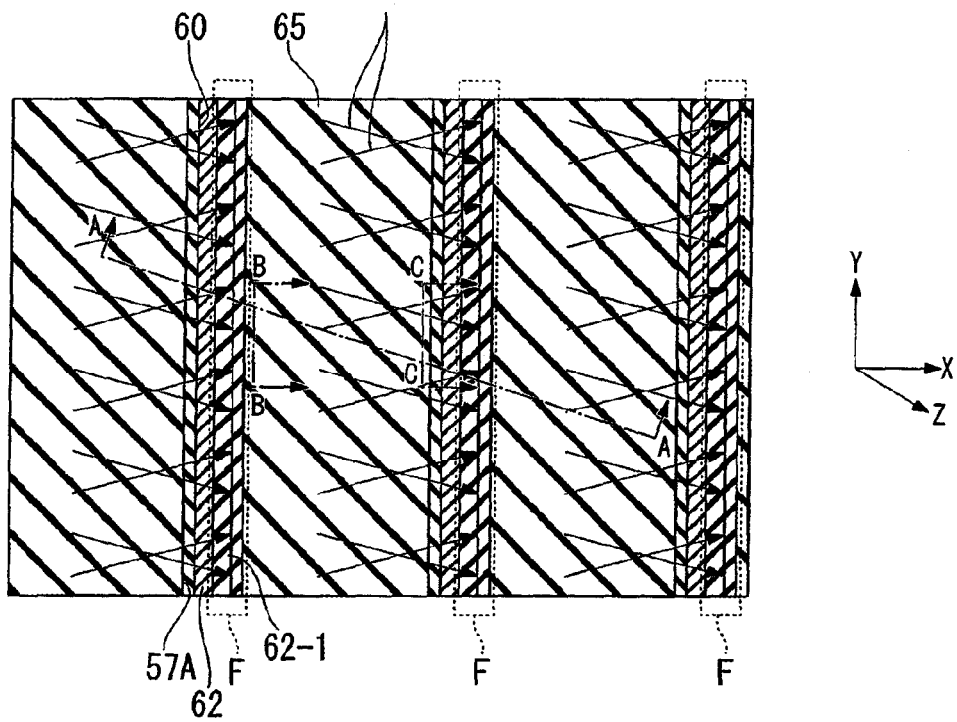
FIG. 5A is a plan view showing a manufacturing step following the manufacturing step illustrated in FIG. 4A.
Figure 5B:
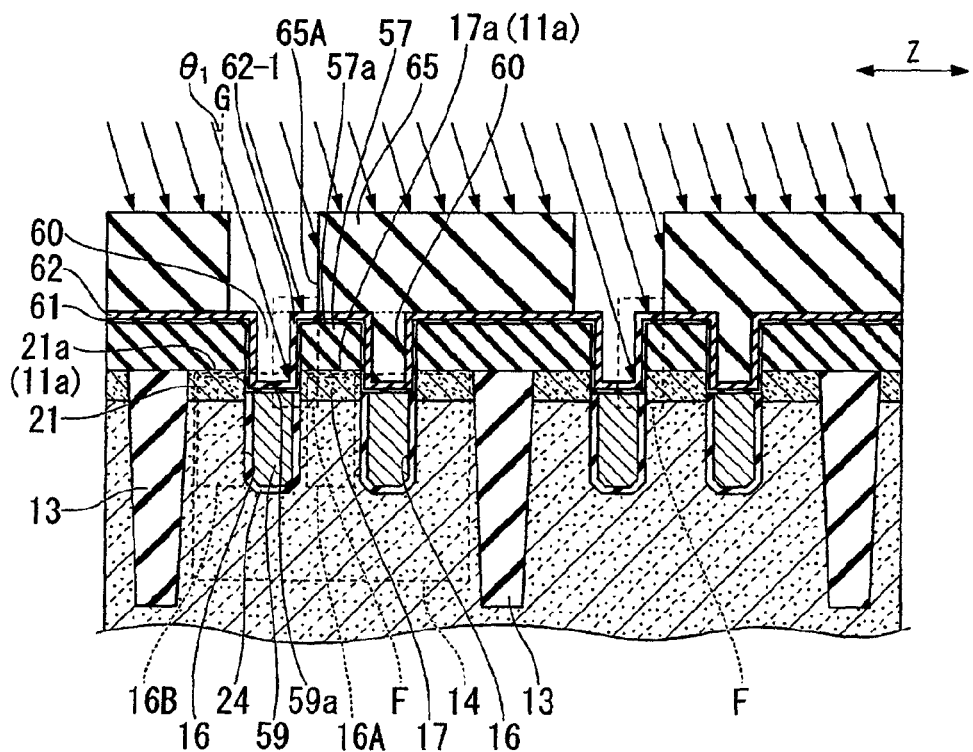
FIG. 5B is a cross-sectional view showing a primary portion of the memory cell array taken along line A-A of FIG. 5A.
Figure 5C:
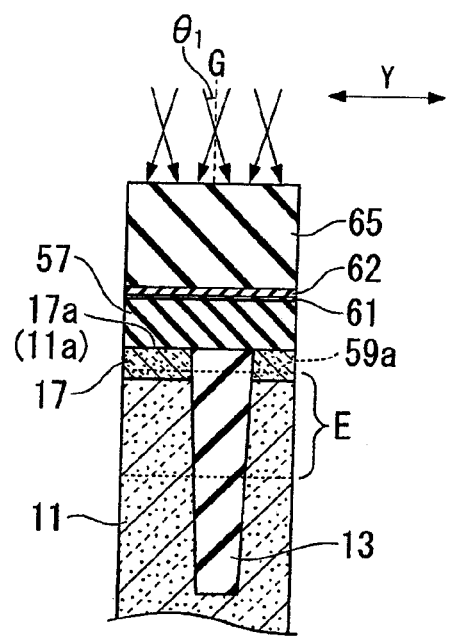
FIG. 5C is a cross-sectional view showing a primary portion of the memory cell array taken along line B-B of FIG. 5A.
Figure 5D:
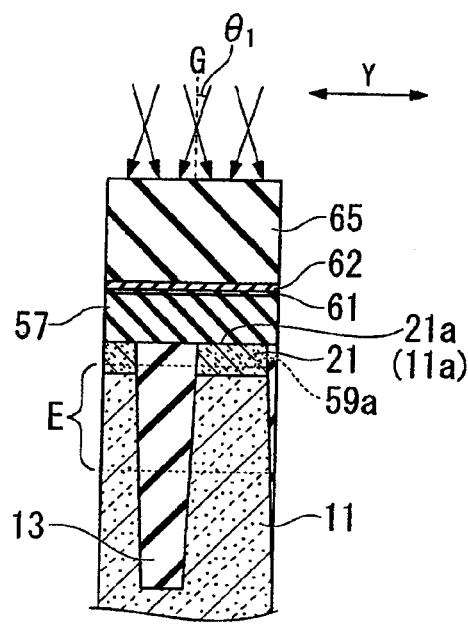
FIG. 5D is a cross-sectional view showing a primary portion of the memory cell array taken along line C-C of FIG. 5A.

Then impurity ions (e.g., $BF_2$) are selectively implanted into part of the amorphous silicon film 62 that corresponds to implantation areas F illustrated in FIG. 4B by an oblique ion implantation method. Thus, the amorphous silicon film 62 is modified as shown in FIG. 5B.

A portion of the amorphous silicon film 62 that corresponds to one of the implantation areas F includes part of the amorphous silicon film 62 that has been formed on a sidewall of the groove portion 60 located near the first lateral portion 16A of the groove 16, part of the amorphous silicon film 62 that has been formed above the etching mask 57 and located near the sidewall of the groove portion 60, and part of the amorphous silicon film 62 that has been formed above the upper surface 59a of the conductive film 59 and located near the sidewall of the groove portion 60.

Hereinafter, the amorphous silicon film 62 modified in the implantation areas F is referred to as a modified amorphous silicon film 62-1.

An implantation angle $\theta_1$ (angle between a plane G perpendicular to the primary surface 11a of the semiconductor substrate 11 and an implantation direction of impurity ions) for the oblique ion implantation performed in the step illustrated in FIGS. 5A to 5D may properly be selected depending upon the depth of the groove portions 60, the thickness of the photoresist film 65, the width of the opening grooves 65A, and the like.

In a subsequent step illustrated in FIGS. 6A to 6D, the photoresist film 65 shown in FIGS. 5A to 5D is removed. Then a photoresist film 67 having opening grooves 67A formed therein is formed on the amorphous silicon film 62. Each of the opening grooves 67A of the photoresist film 67 exposes a second of the two groove portions 60 formed in the active region 14 (the right one of two groove portions 60 in FIG. 6B).

At that time, opening grooves 67A are formed so as to have a width greater than the width of the groove portions 60. Thus, part of the amorphous silicon film 62 that has been formed on the inner surfaces of the groove portions 60 and part of the amorphous silicon film 62 that has been located on both sides of the upper portions of the groove portions 60 and located above the etching mask 57 are exposed from the photoresist film 67.

Figure 6A:
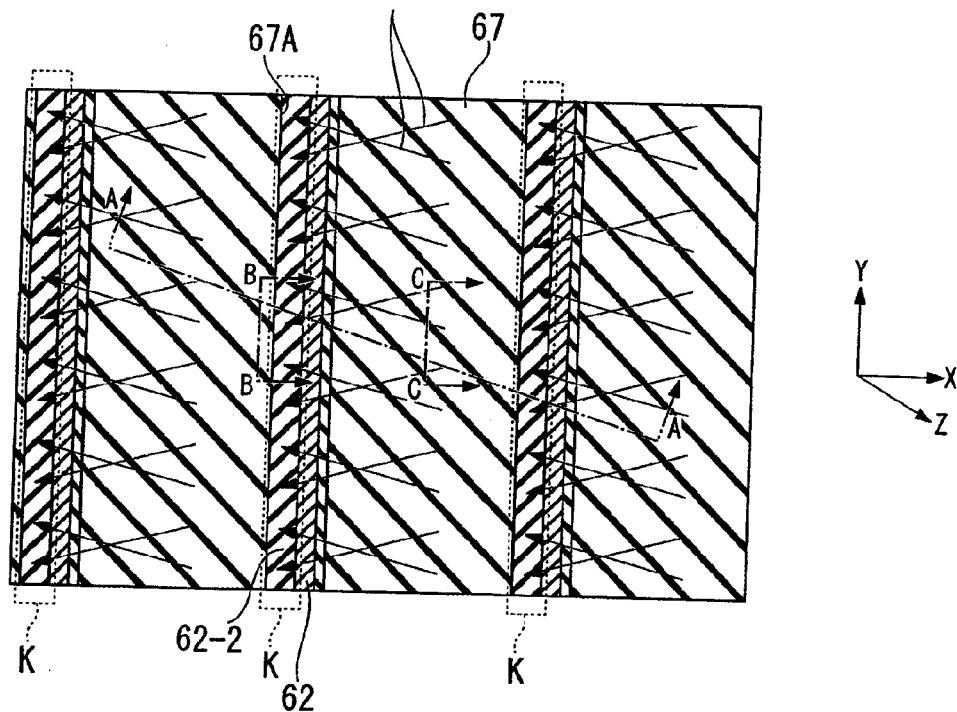
FIG. 6A is a plan view showing a manufacturing step following the manufacturing step illustrated in FIG. 5A.
Figure 6B:
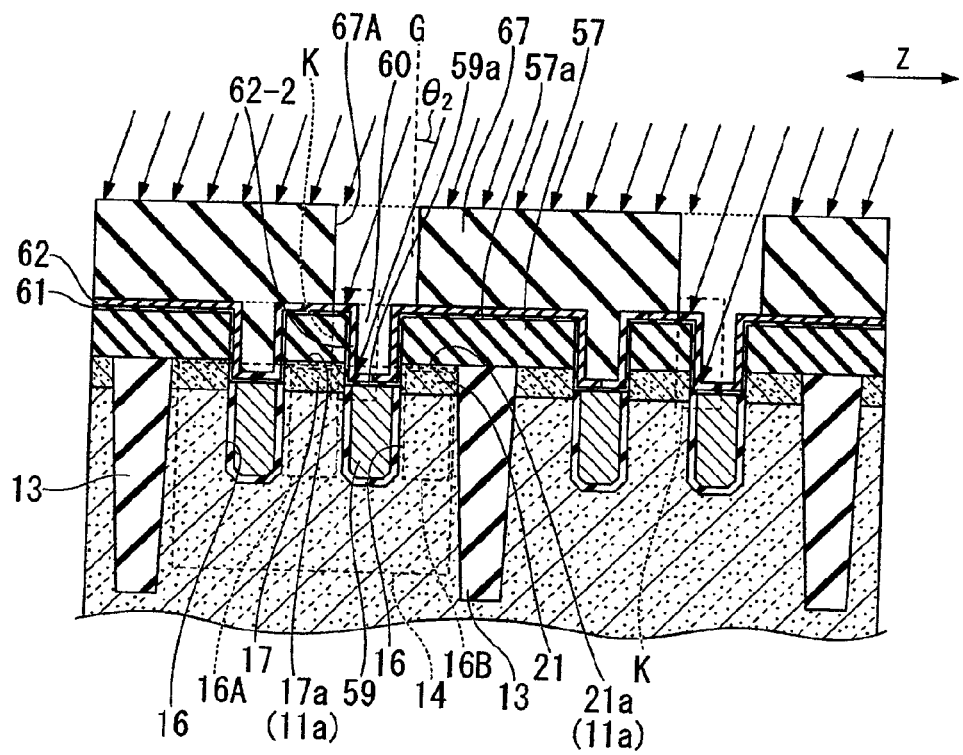
FIG. 6B is a cross-sectional view showing a primary portion of the memory cell array taken along line A-A of FIG. 6A.

Then impurity ions (e.g., $BF_2$) are selectively implanted into part of the amorphous silicon film 62 that corresponds to implantation areas K illustrated in FIG. 6B by an oblique ion implantation method. Thus, the amorphous silicon film 62 is modified as shown in FIG. 6B.

A portion of the amorphous silicon film 62 that corresponds to one of the implantation areas K includes part of the amorphous silicon film 62 that has been formed on a sidewall of the groove portion 60 located near the first lateral portion 16A of the groove 16, part of the amorphous silicon film 62 that has been formed above the etching mask 57 and located near the sidewall of the groove portion 60, and part of the amorphous silicon film 62 that has been formed above the upper surface 59a of the conductive film 59 and located near the sidewall of the groove portion 60.

Hereinafter, the amorphous silicon film 62 modified in the implantation areas K is referred to as a modified amorphous silicon film 62-2.

An implantation angle $\theta_2$ (angle between a plane G perpendicular to the primary surface 11a of the semiconductor substrate 11 and an implantation direction of impurity ions) for the oblique ion implantation performed in the step illustrated in FIGS. 6A to 6D may properly be selected depending upon the depth of the groove portions 60, the thickness of the photoresist film 67, the width of the opening grooves 67A, and the like.

Figure 6C:
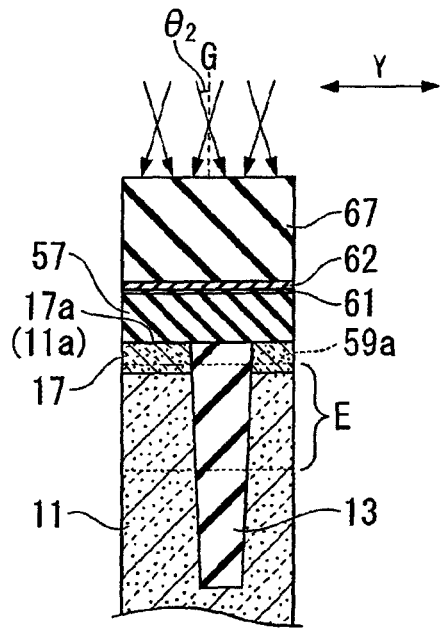
FIG. 6C is a cross-sectional view showing a primary portion of the memory cell array taken along line B-B of FIG. 6A.
Figure 6D:
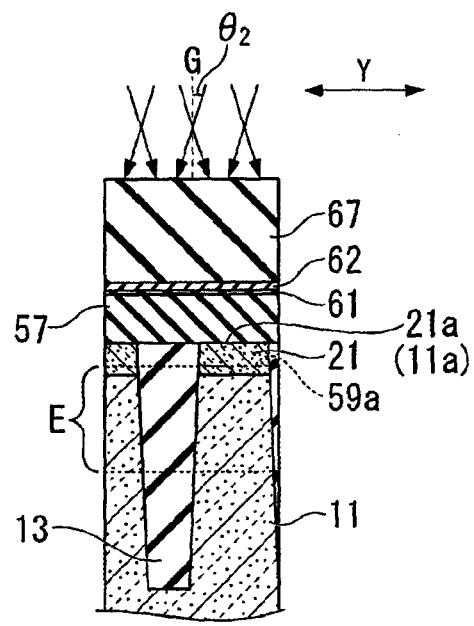
FIG. 6D is a cross-sectional view showing a primary portion of the memory cell array taken along line C-C of FIG. 6A.

In a subsequent step illustrated in FIGS. 7A to 7D, the photoresist film 67 shown in FIGS. 6A to 6D is removed, so that part of the amorphous silicon film 62 that has not been modified (non-modified amorphous silicon film) as shown in FIGS. 6B to 6D is exposed.

It has been known that the modified amorphous silicon films 62-1 and 62-2 and the non-modified amorphous silicon film 62 thus produced have selectivities for specific etching processes.

In a subsequent step, only the non-modified amorphous silicon film 62 is removed by wet etching with an etching liquid that can selectively remove the non-modified amorphous silicon film 62 (see FIGS. 6A to 6D). Thus, the modified amorphous silicon films 62-1 and 62-2 remain.

For example, the non-modified amorphous silicon film 62 can be removed selectively with respect to the modified amorphous silicon films 62-1 and 62-2 by using an etching liquid containing hydrazine, an etching liquid containing $NH_4OH$ and $H_2O_2$, or the like. Thus, a surface 61a of the protective film 61 that has been covered with the non-modified amorphous silicon film 62 is exposed.

In a subsequent step illustrated in FIGS. 8A to 8D, part of the protective film 61 that is not covered with the modified amorphous silicon films 62-1 and 62-2 is removed by anisotropic dry etching that uses the modified amorphous silicon films 62-1 and 62-2 as a mask.

Figure 7B:
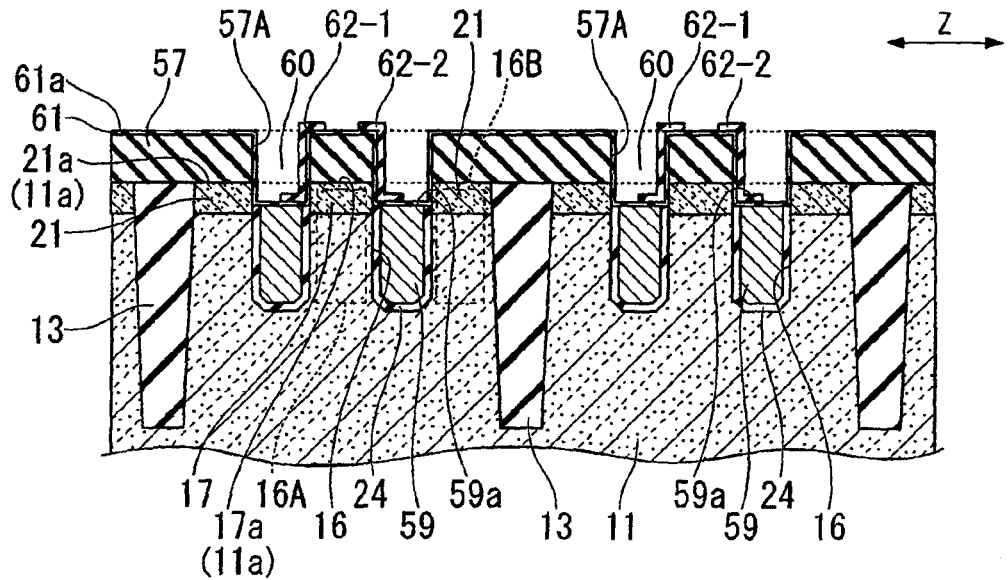
FIG. 7B is a cross-sectional view showing a primary portion of the memory cell array taken along line A-A of FIG. 7A.
Figure 7C:
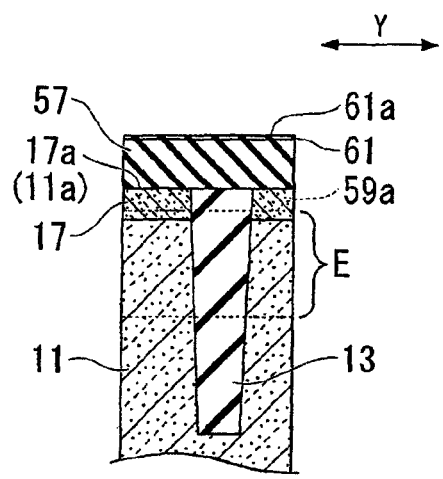
FIG. 7C is a cross-sectional view showing a primary portion of the memory cell array taken along line B-B of FIG. 7A.
Figure 7D:
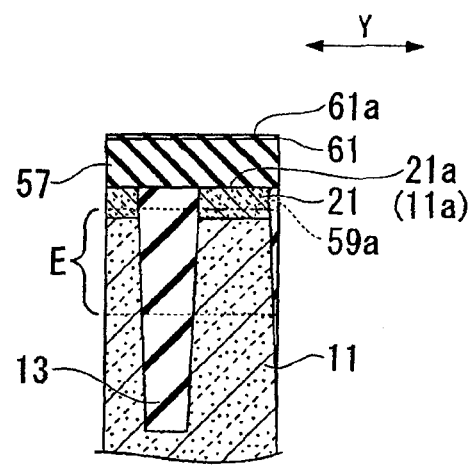
FIG. 7D is a cross-sectional view showing a primary portion of the memory cell array taken along line C-C of FIG. 7A.

Thus, the upper surface 57a of the etching mask 57, sidewalls of the grooves 60 located near the second lateral portions 16B shown in FIG. 7B, and part of the upper surface 59a of the conductive film 59 that is located near the second lateral portions 16B of the grooves 16 shown in FIG. 7B are exposed.

Subsequently, part of the upper surface 59a of the conductive film 59 that is located near the second lateral portions 16B of the grooves 16 shown in FIG. 7B is etched by anisotropic dry etching that uses the etching mask 57 and the modified amorphous silicon films 62-1 and 62-2 as a mask. Thus, etched upper surfaces of the conductive films 59 (upper surfaces 25b of the gate electrodes 25) are positioned at the depth $D_2$ from the primary surface 11a of the semiconductor substrate 11.

In this manner, the gate electrodes 25 having the following structure are formed in the grooves 16. The depth $D_2$ measured from the primary surface 11a of the semiconductor substrate 11 to the upper surfaces 25b of the gate electrodes 25 that are located near the second lateral portions 16B is greater than the depth $D_1$ measured from the primary surface 11a of the semiconductor substrate 11 to the upper surfaces 25a of the gate electrodes 25 that are located near the first lateral portions 16A. Each of the gate electrodes 25 has a step with the upper surfaces 25a and 25b. The gate electrodes 25 are formed by the conductive films 59.

Figure 8A:
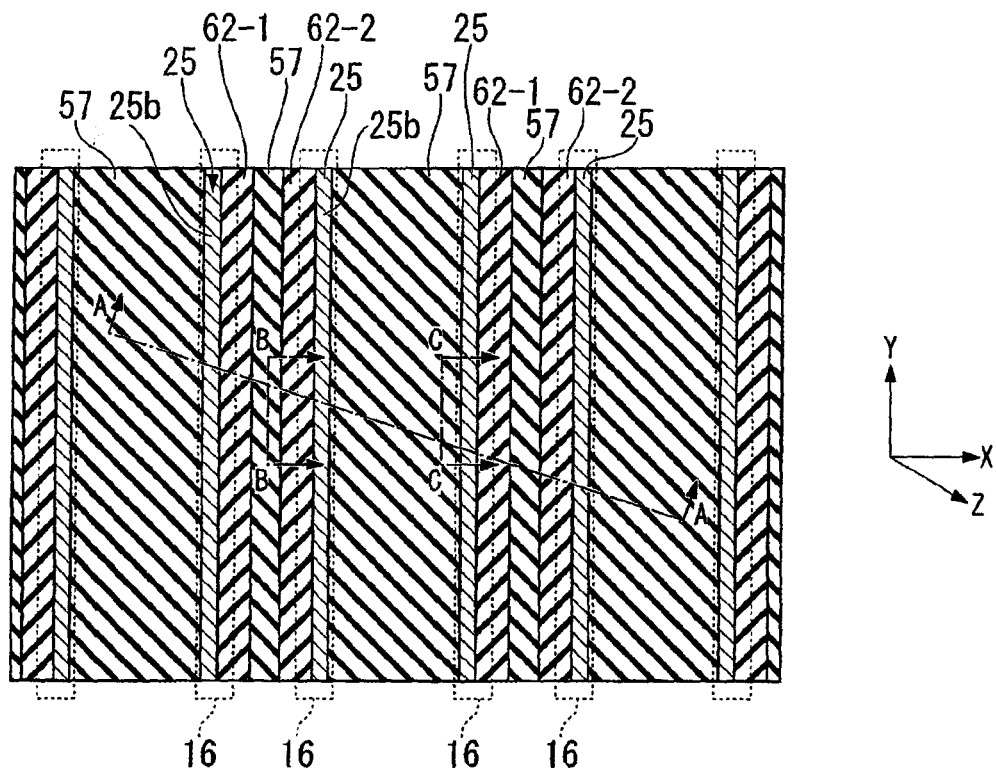
FIG. 8A is a plan view showing a manufacturing step following the manufacturing step illustrated in FIG. 7A.
Figure 8B:
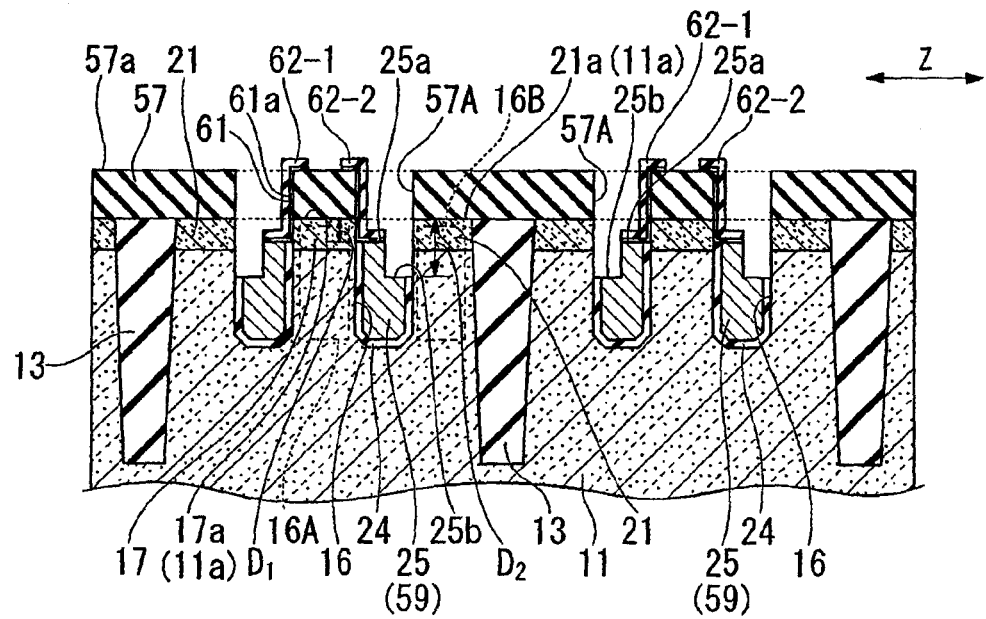
FIG. 8B is a cross-sectional view showing a primary portion of the memory cell array taken along line A-A of FIG. 8A.
Figure 8C:
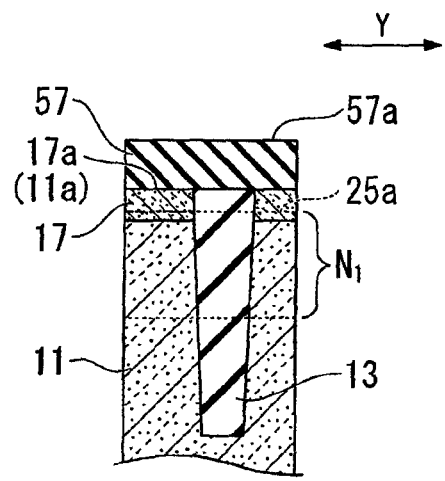
FIG. 8C is a cross-sectional view showing a primary portion of the memory cell array taken along line B-B of FIG. 8A.
Figure 8D:
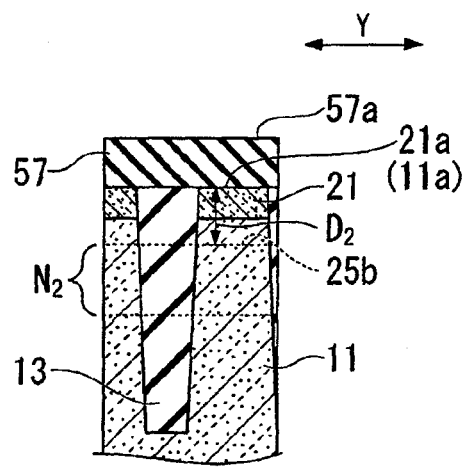
FIG. 8D is a cross-sectional view showing a primary portion of the memory cell array taken along line C-C of FIG. 8A.
Figure 9A:
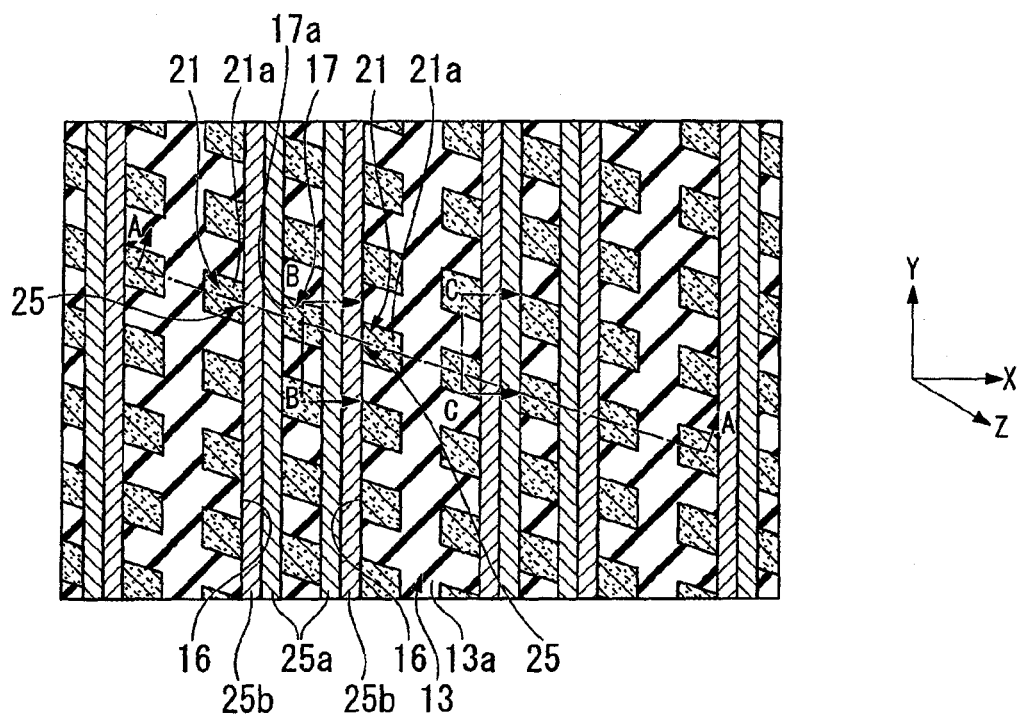
FIG. 9A is a plan view showing a manufacturing step following the manufacturing step illustrated in FIG. 8A.
Figure 9B:
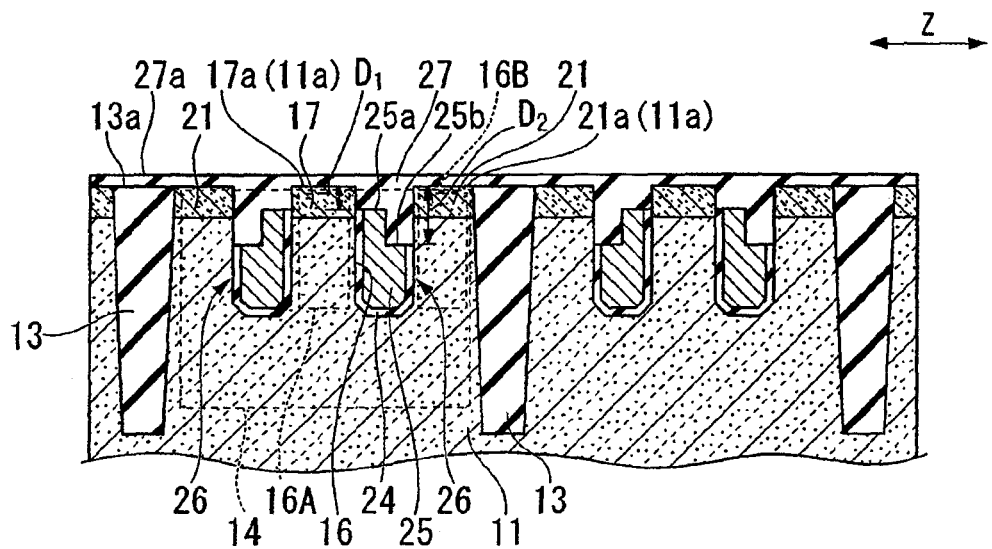
FIG. 9B is a cross-sectional view showing a primary portion of the memory cell array taken along line A-A of FIG. 9A.
Figure 9C:
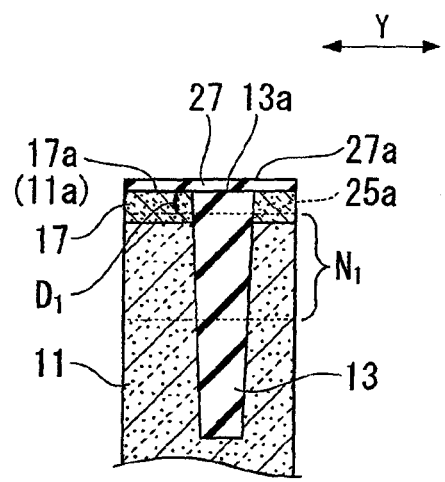
FIG. 9C is a cross-sectional view showing a primary portion of the memory cell array taken along line B-B of FIG. 9A.
Figure 9D:
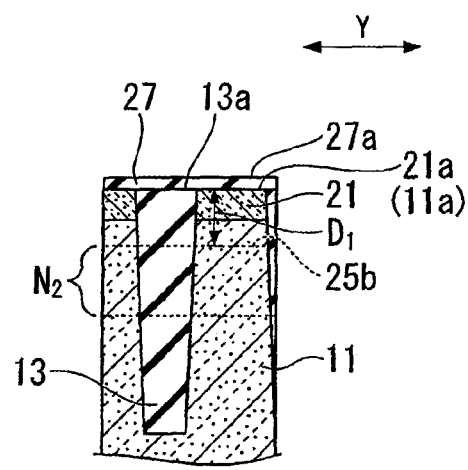
FIG. 9D is a cross-sectional view showing a primary portion of the memory cell array taken along line C-C of FIG. 9A.

In a subsequent step illustrated in FIGS. 9A to 9D, the modified amorphous silicon films 62-1 and 62-2 shown in FIGS. 8A and 8B are removed by using a well-known technique after the formation of the aforementioned steps in the gate electrodes 25. Thus, surfaces 61a of the protective film 61 as shown in FIG. 8B are exposed.

Subsequently, the protective film 61 and the etching mask 57, which are formed of a silicon nitride film (SiN film), are removed by using a well-known technique. Thus, the upper surfaces 17a of the first impurity diffusion regions 17, the upper surfaces 21a of the second impurity diffusion regions 21, the upper surfaces 13a of the device isolation region 13, and the upper surfaces 25a and 25b of the gate electrodes 25 are exposed.

Since a silicon nitride film (SiN film) is used for the etching mask 57 and the protective film 61, the etching mask 57 and the protective film 61 can correctively be removed. Therefore, the manufacturing process of the semiconductor device 10 can be simplified.

At that time, selection transistors 26 (field effect transistors) each including the groove 16, the gate insulation film 24, the gate electrode 25, the first impurity diffusion region 17, and the second impurity diffusion region 21 are formed. Two selection transistors 26 are formed in one active region 14.

Thereafter, an interlayer dielectric film 27 for bit contact is formed so as to cover the upper surfaces 17a of the first impurity diffusion regions 17, the upper surfaces 21a of the second impurity diffusion regions 21, the upper surfaces 13a of the device isolation region 13, and the upper surfaces 25a and 25b of the gate electrodes 25 and to fill the grooves 16 in which the gate electrodes 25 have been formed. The interlayer dielectric film 27 has a flattened upper surface 27a.

For example, the interlayer dielectric film 27 for bit contact is formed in the following manner. First, a silicon nitride film (SiN film) is deposited by an atomic layer deposition (ALD) method. The silicon nitride film has such a thickness that the grooves 16 are not fully filled with the silicon nitride film.

Then a silicon oxide film ($SiO_2$ film) is formed on a surface of the silicon nitride film (SiN film) by a chemical vapor deposition (CVD) method. The silicon oxide film has such a thickness that the grooves 16 are filled with the silicon oxide film.

Then a surface of the silicon oxide film ($SiO_2$ film) is polished by a CMP method. Thus, the interlayer dielectric film 27 for bit contact with a flattened upper surface 27a is produced from the silicon nitride film (SiN film) and the silicon oxide film ($SiO_2$ film).

In a subsequent step illustrated in FIGS. 10A to 10D, part of the interlayer dielectric film 27 for bit contact is etched by using well-known photolithography technology and anisotropic dry etching technology. Thus, bit contact openings 27A are formed so as to expose the upper surfaces 17a and upper portions of the sidewall surfaces 17b of the first impurity diffusion regions 17.

Thereafter, a conductive film, which is a base material of the bit contact plugs 29 and the bit lines 31, and an insulation film (e.g., a silicon nitride film (SiN film)), which is a base material of the cap insulation films 32, are sequentially stacked by using a well-known technique.

Then the conductive film and the insulation film are etched and patterned by photolithography technology and anisotropic dry etching technology. Thus, the bit contact plugs 29 filled in the bit contact openings 27A, the bit lines 31 extending along the X-direction, and the cap insulation films 32 covering the upper surfaces of the bit lines 31 are collectively formed.

The contact plugs 29 are filled in the bit contact openings 27A. Therefore, the contact plugs 29 are held in contact with the upper surfaces 17a and the upper portions of the sidewall surfaces 17b of the first impurity diffusion regions 17.

Accordingly, first contact portions 18A are formed at interfaces between the upper surfaces 17a of the first impurity diffusion regions 17 and the bit contact plugs 29, and second contact portions 18B are formed at interfaces between the upper portions of the sidewall surfaces 17b of the first impurity diffusion regions 17 and the bit contact plugs 29.

For example, a film primarily including a polycrystalline silicon film (doped polysilicon film) in which impurities having a conductivity type (n-type in the first embodiment) that is inverse to the conductivity type (p-type in the first embodiment) of the semiconductor substrate 11 have been doped may be used as a conductive film that is a base material of the bit contact plugs 29.

Subsequently, by using a well-known technique, a liner film 34 is formed so as to cover the sidewalls of the bit lines 31, the upper surfaces and the sidewalls of the cap insulation films 32, and the upper surfaces 27a of the interlayer dielectric films 27 for bit contact located on the upper surfaces 13a of the device isolation region 13 and the upper surfaces 21a of the second impurity diffusion regions 21.

At that time, the liner film 34 is formed so as to have such a thickness that spaces formed between the bit lines 31 are not fully filled with the liner film 34.

Specifically, a silicon nitride film (SiN film) is deposited by an ALD method. Thus, a liner film 34 of the silicon nitride film (SiN film) is formed.

Subsequently, interlayer dielectric films 35 for capacitance contact are formed by using a well-known technique so that grooves formed between layered products each including the bit line 31 and the cap insulation film 32 are filled with the interlayer dielectric films 35. Each of the interlayer dielectric films 35 has a flattened upper surface 35a.

At that time, the interlayer dielectric films 35 for capacitance contact are formed such that the upper surfaces 35a of the interlayer dielectric films 35 are flush with the upper surfaces 34a of the liner films 34 formed on the cap insulation films 32.

For example, a coating type insulation film (an insulation film made of a material such as polysilazane) formed by using a spinner may be used as a base material for the interlayer dielectric films 35 for capacitance contact.

Then an insulation film 71 for mask formation (silicon oxide film ($SiO_2$ film)) is formed by using a well-known technique so as to cover the upper surfaces 34a of the liner films 34 and the upper surfaces 35a of the interlayer dielectric films 35 for capacitance contact.

The insulation film 71 for mask formation serves as an etching mask used for etching the interlayer dielectric films 35 for capacitance contact.

Therefore, it is preferable for a base material of the insulation film 71 for mask formation to be different from the liner films 34 and to have an etching rate lower than that of the interlayer dielectric films 35 for capacitance contact.

Figure 10A:
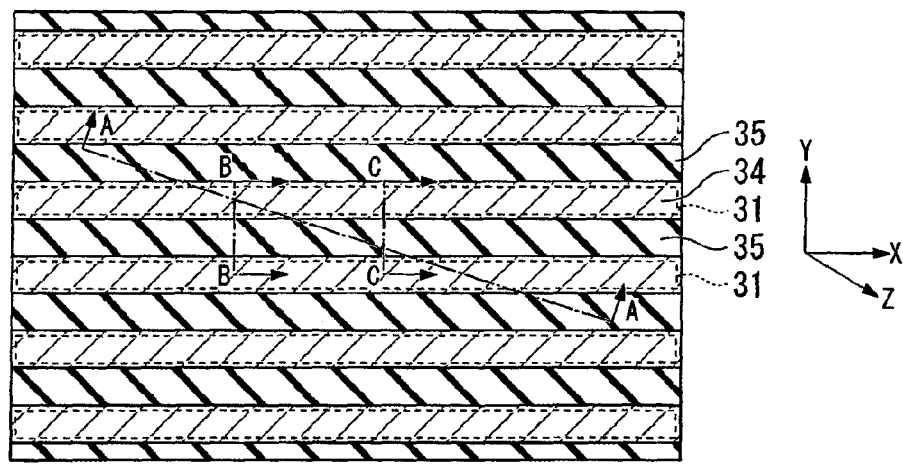
FIG. 10A is a plan view showing a manufacturing step following the manufacturing step illustrated in FIG. 9A.
Figure 10B:
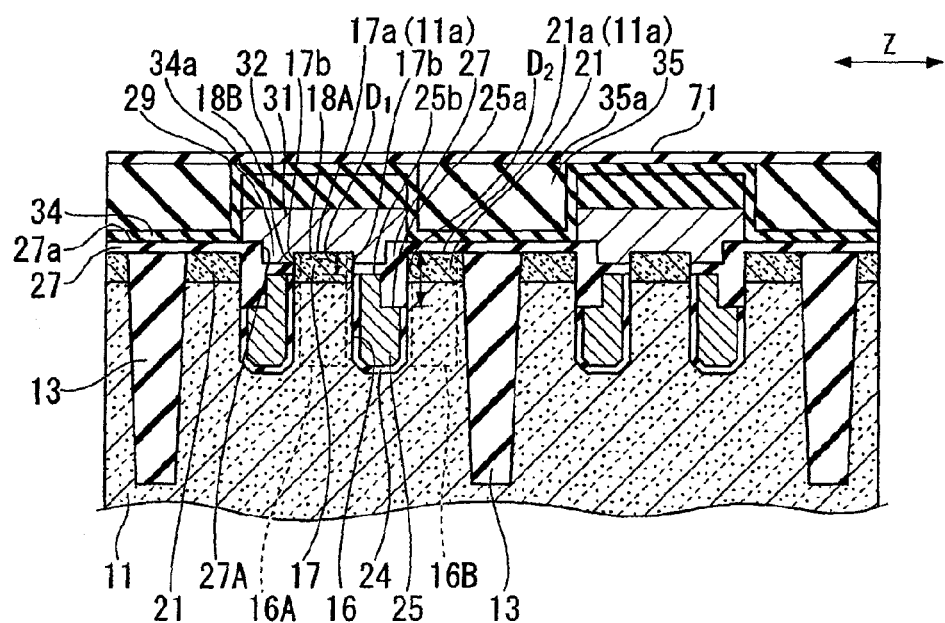
FIG. 10B is a cross-sectional view showing a primary portion of the memory cell array taken along line A-A of FIG. 10A.
Figure 10C:
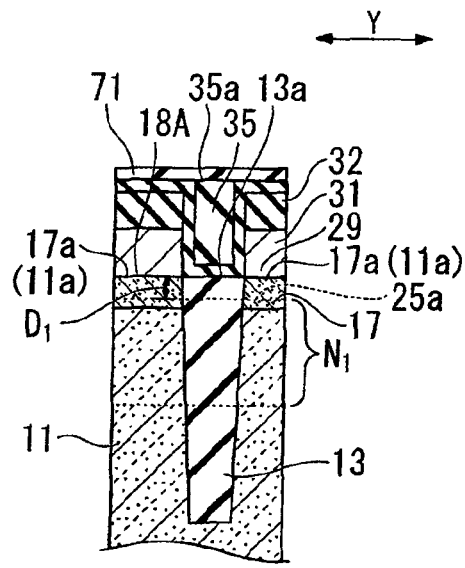
FIG. 10C is a cross-sectional view showing a primary portion of the memory cell array taken along line B-B of FIG. 10A.
Figure 10D:
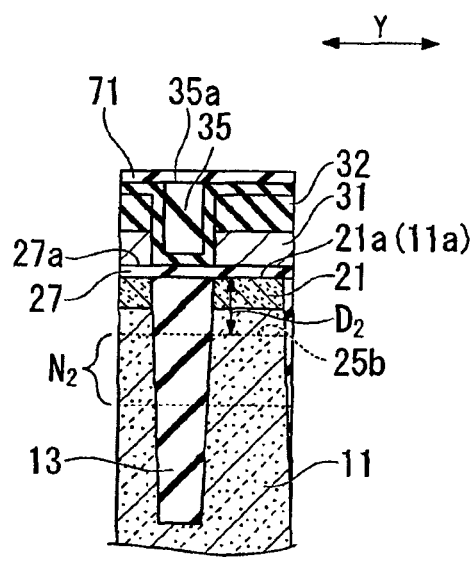
FIG. 10D is a cross-sectional view showing a primary portion of the memory cell array taken along line C-C of FIG. 10A.

In a subsequent step illustrated in FIGS. 11A to 11D, the insulation film 71 for mask formation shown in FIGS. 10B to 10D is patterned by well-known photolithography technology and anisotropic dry etching technology. Thus, groove-like openings (not shown) extending along the Y-direction are formed.

Then contact holes 37 are formed by a self-aligned contact (SAC) method using the patterned insulation film 71 for mask formation. Each of the contact holes 37 extends through the interlayer dielectric film 27 for bit contact, the liner film 34, and the interlayer dielectric film 35 for capacitance contact, which have been stacked on the second impurity diffusion region 21. Each of the contact holes 37 exposes part of the upper surface 21a of the second impurity diffusion region 21.

Subsequently, a sidewall film 38 is formed by using a well-known technique so as to cover sidewalls of the contact holes 37. Specifically, the surfaces of the liner films 34 on which the contact holes 37 are exposed, sidewalls of the interlayer dielectric films 27 for bit contact, sidewalls of the liner film 34, and sidewalls of the interlayer dielectric films 35 for capacitance contact are covered with the sidewall film 38.

Specifically, the sidewall film 38 is formed by depositing a silicon nitride film (SiN film) as a base material of the sidewall film 38 and then performing an etching-back process on the silicon nitride film (SiN film).

At that time, the upper surfaces 21a of the second impurity diffusion regions 21 are exposed from the sidewall film 38.

Then the contact holes 37 are filled with a conductive film (not shown) by using a well-known technique while the sidewall film 38 is interposed between the sidewalls of the contact holes 37 and the conductive film. For example, a conductive film primarily including a polycrystalline silicon film (doped polysilicon film) in which impurities having a conductivity type (n-type in the first embodiment) that is inverse to the conductivity type (p-type in the first embodiment) of the semiconductor substrate 11 have been doped may be used for the conductive film (the conductive film as a base material for the capacitance contact plugs 41). Nevertheless, a doped polysilicon film in which impurities have been doped at a high concentration, a metal film, a silicide film, and a film in which those films are stacked may be used for the conductive film.

Then an excess conductive film formed above the upper surfaces 35a of the interlayer dielectric films 35 for capacitance contact is removed by a CMP process. Thus, capacitance contact plugs 41 are formed so that each of the capacitance contact plugs 41 has an upper surface 41a that is flush with the upper surfaces 35a of the interlayer dielectric films 35 for capacitance contact.

Since the contact holes 37 are filled with the capacitance contact plugs 41, each of the capacitance contact plugs 41 is held in contact with the upper surface 21a of the second impurity diffusion region 21.

Subsequently, capacitance contact pads 42 are formed on part of the upper surfaces 34a of the liner films 34 and part of the upper surfaces 35a of the interlayer dielectric films 35 for capacitance contact by using a well-known technique. Each of the capacitance contact pads 42 is held in contact with at least part of the upper surface 41a of the corresponding capacitance contact plug 41.

Thus, each of the capacitance contact pads 42 is electrically connected to the corresponding second impurity diffusion region 21 via the capacitance contact plug 41.

Then a silicon nitride film 44 is formed on the upper surfaces 34a of the liner films 34, the upper surfaces 35a of the interlayer dielectric films 35 for capacitance contact, and the upper surfaces 41a of the capacitance contact plugs 41 by using a well-known technique. The silicon nitride film 44 is formed so as to surround peripheries of the capacitance contact pads 42.

Then crown-shaped lower electrodes 47 are formed on the capacitance contact pads 42 by using a well-known technique. At that time, one lower electrode 47 is formed for each of the capacitance contact pads 42.

Thus, each of the lower electrodes 47 is electrically connected to the corresponding second impurity diffusion region 21 via the capacitance contact pad 42.

Then a capacitance insulation film 48 is formed by using a well-known technique so as to cover surfaces of the lower electrodes 47 exposed from the silicon nitride film 44 and the upper surface of the silicon nitride film 44. Then an upper electrode 49 is formed so as to cover a surface of the capacitance insulation film 48.

Thus, a plurality of capacitors 46, each of which includes one lower electrode 47, the capacitance insulation film 48, which is common to a plurality of lower electrodes 47, and the upper electrode 49, which is common to a plurality of lower electrodes 47, are formed. At the same time, a plurality of memory cells 51, each of which includes one selection transistor 26 and one capacitor 46, are formed.

Subsequently, a capacitance plate 52 is formed so as to fill the interiors of the lower electrodes 47 on which the capacitance insulation film 48 and the upper electrode 49 have been formed and gaps between adjacent lower electrodes 47. The capacitance plate 52 has a flattened upper surface 52a.

Figure 12A:
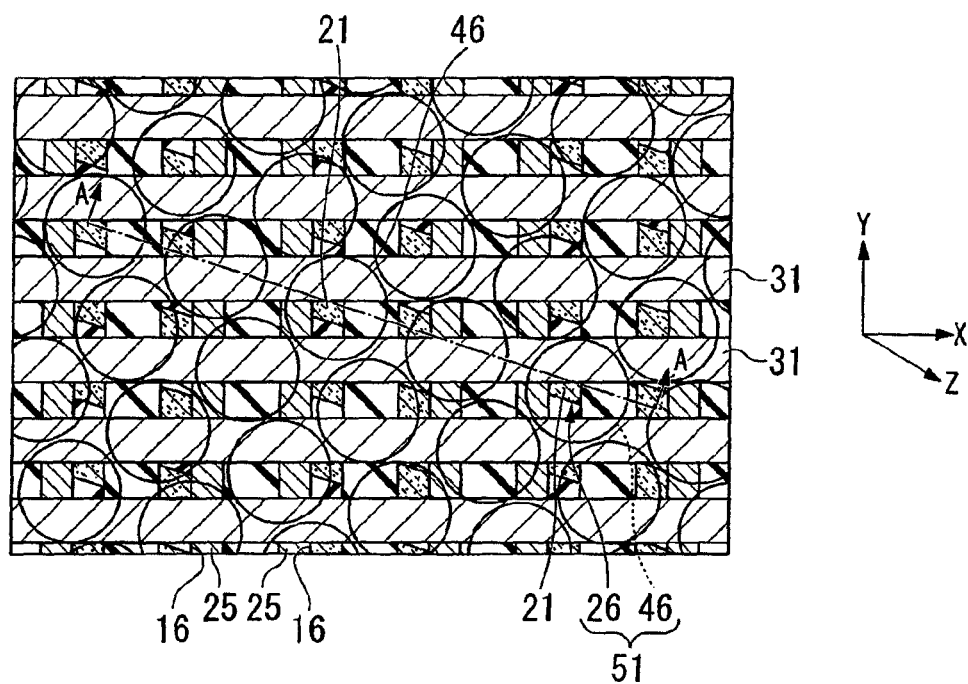
FIG. 12A is a plan view showing a manufacturing step following the manufacturing step illustrated in FIG. 11A.
Figure 12B:
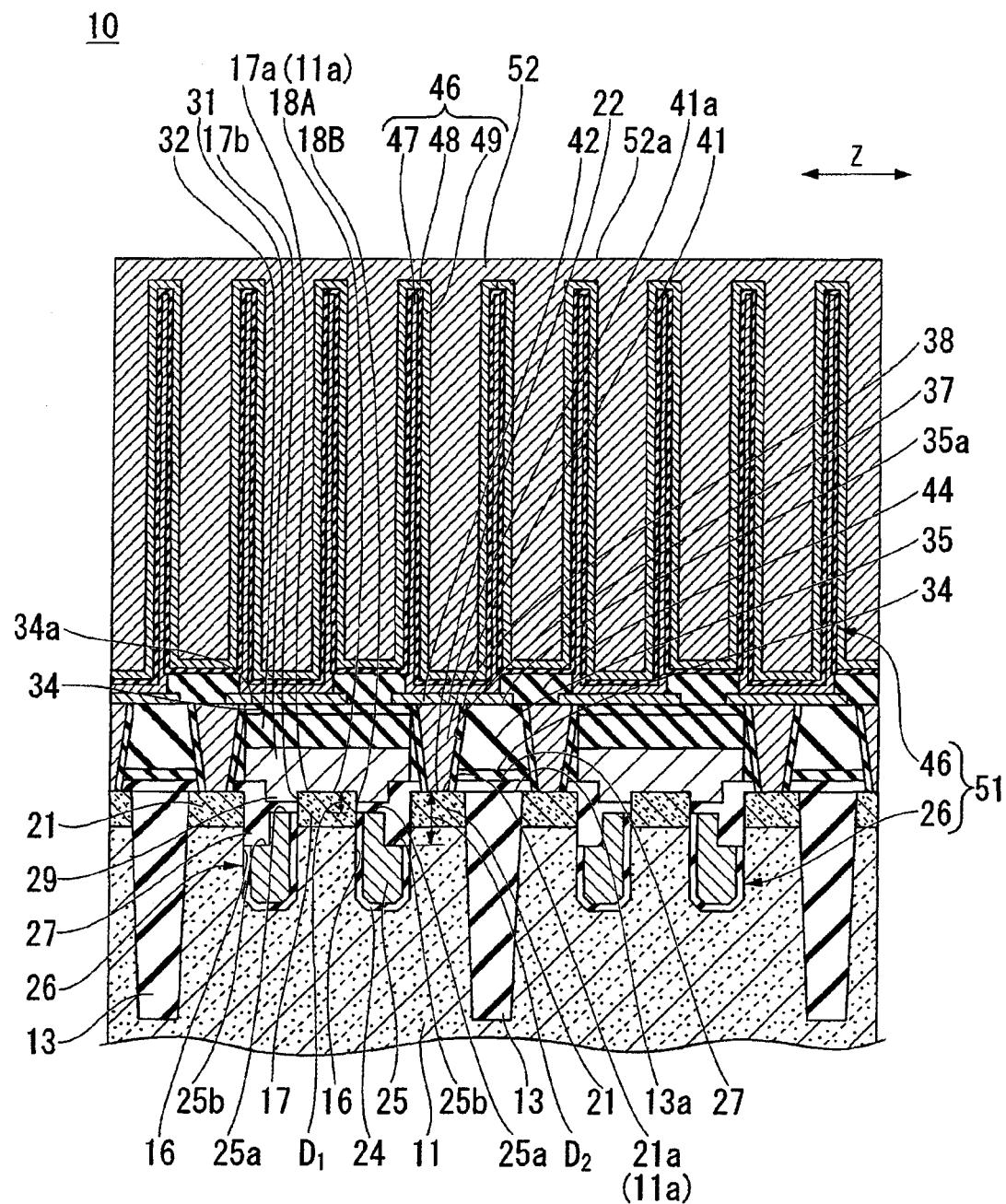
FIG. 12B is a cross-sectional view showing a primary portion of the memory cell array taken along line A-A of FIG. 12A.

The semiconductor device 10 may be produced in the following manner, which is not illustrated in FIGS. 12A and 12B. An interlayer dielectric film (not shown) is formed on the capacitance plate 52. Then contact plugs (not shown) are formed so as to extend through the interlayer dielectric film so that the contact plugs are connected to the upper electrode 49. Thereafter, wires (not shown) and the like are formed on the interlayer dielectric film so that those wires are connected to the contact plugs.

A method of manufacturing a semiconductor device according to the first embodiment includes a step of digging a primary surface 11a of a semiconductor substrate 11 in a depth direction to form grooves 16; a step of forming bit contact plugs (first conductors) held in contact with upper surfaces 17a of first impurity diffusion regions 17 located at upper portions of first lateral portions 16A of the grooves 16; a step of forming capacitance contact plugs 41 (second conductors) held in contact with upper surfaces 21a of second impurity diffusion regions 21 located at upper portions of second lateral portions 16B of the grooves 16; and a step of forming gate electrodes 25 within the grooves 16 while gate insulation films 24 are interposed between the gate electrodes 25 and sidewalls of the grooves 16. In the step of forming the gate electrodes 25, the depth $D_2$ measured from the upper surfaces 21a of the second impurity diffusion regions 21 (the primary surface 11a of the semiconductor substrate 11) to upper surfaces 25b of the gate electrodes 25 that are located near the second lateral portions 16B is set to be greater than the depth $D_1$ measured from the upper surfaces 17a of the first impurity diffusion regions 17 (the primary surface 11a of the semiconductor substrate 11) to upper surfaces 25a of the gate electrodes 25 that are located near the first lateral portions 16A of the gate electrodes 25.

In this manner, third contact portions 22 (contact interfaces) are located away from the channels on the capacitance contact side. Therefore, junction leakage due to concentration of electric fields is reduced. The first and second contact portions 18A and 18B (contact interfaces) are located close to the channels on the bit contact side. Therefore, the parasitic resistance is reduced when the transistors are turned on.

In other words, ON-state currents (Ion) of transistors can be improved without deteriorating the data holding property of the capacitors 46. Thus, trade-off improvements of properties can be achieved concurrently.

Specifically, the $t_{REF}$ characteristics can be maintained by increasing the depth $D_2$ of the upper surface 25b of the gate electrode 25 on the capacitance contact side, where charges stored in a capacitor may possibly leak due to junction leakage. The $t_{WR}$ characteristics can be improved by reducing the depth $D_1$ of the upper surface 25a of the gate electrode 25 on the bit contact side, where no problem of leakage of charges arises.

Second Exemplary Embodiment

Figure 13:
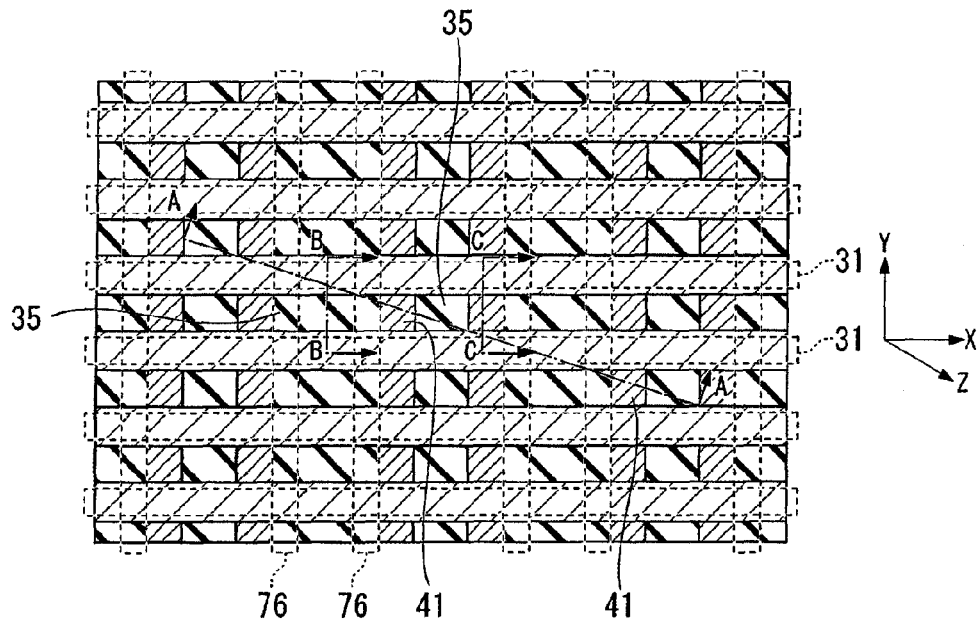
FIG. 13 is a plan view showing part of components of a memory cell array of a semiconductor device according to a second embodiment of the present invention.

FIG. 13 is a plan view showing part of components of a memory cell array in a semiconductor device according to a second embodiment of the present invention. FIG. 13 only illustrates gate electrodes 76, bit lines 31, interlayer dielectric films 35 for capacitance contact, and capacitance contact plugs 41 among components of the semiconductor device 75 according to the second embodiment of the present invention.

Figure 11A:
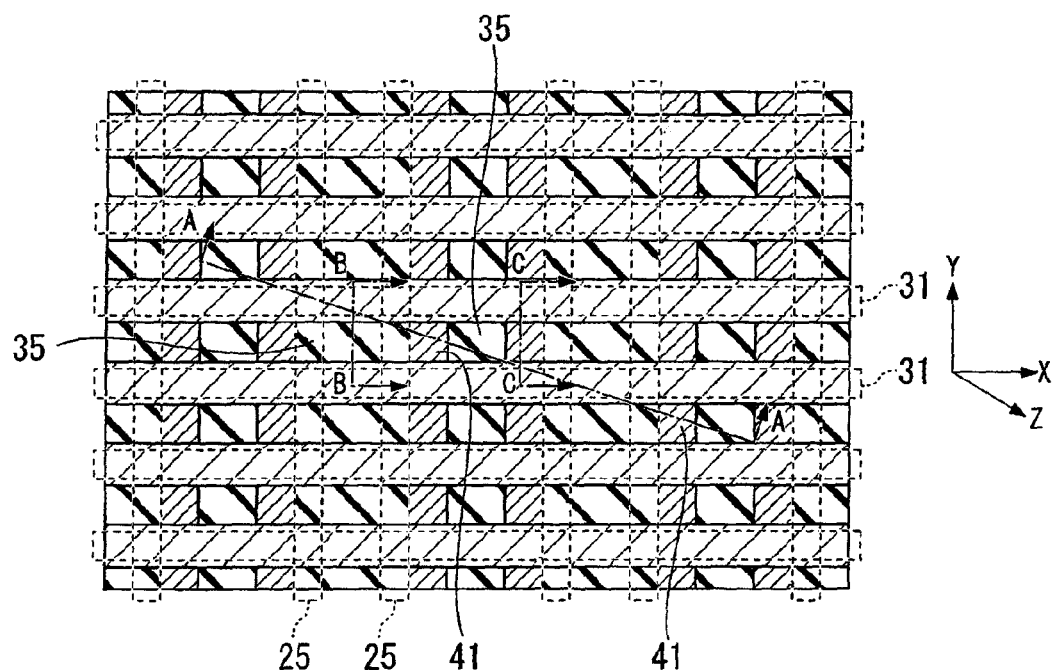
FIG. 11A is a plan view showing a manufacturing step following the manufacturing step illustrated in FIG. 10A.
Figure 11B:
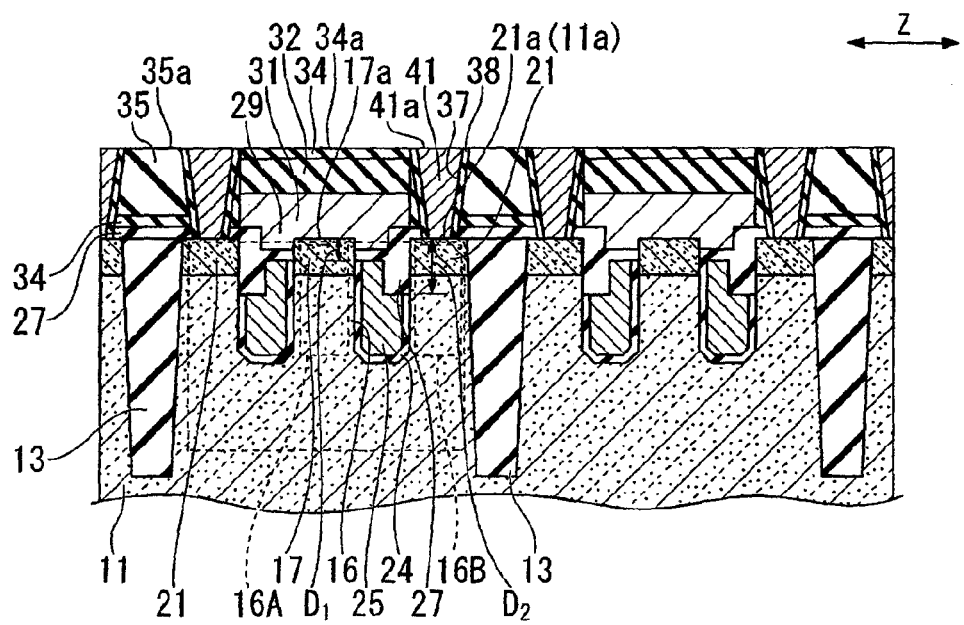
FIG. 11B is a cross-sectional view showing a primary portion of the memory cell array taken along line A-A of FIG. 11A.
Figure 11C:
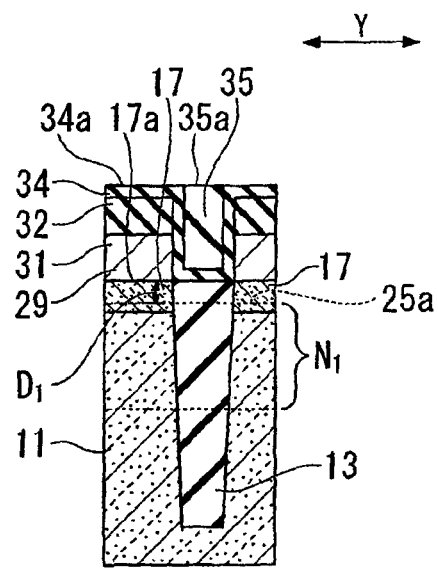
FIG. 11C is a cross-sectional view showing a primary portion of the memory cell array taken along line B-B of FIG. 11A.

In FIG. 13, the same components as in the structures illustrated in FIG. 11A and described in the first embodiment are denoted by the same reference numerals.

Figure 14:
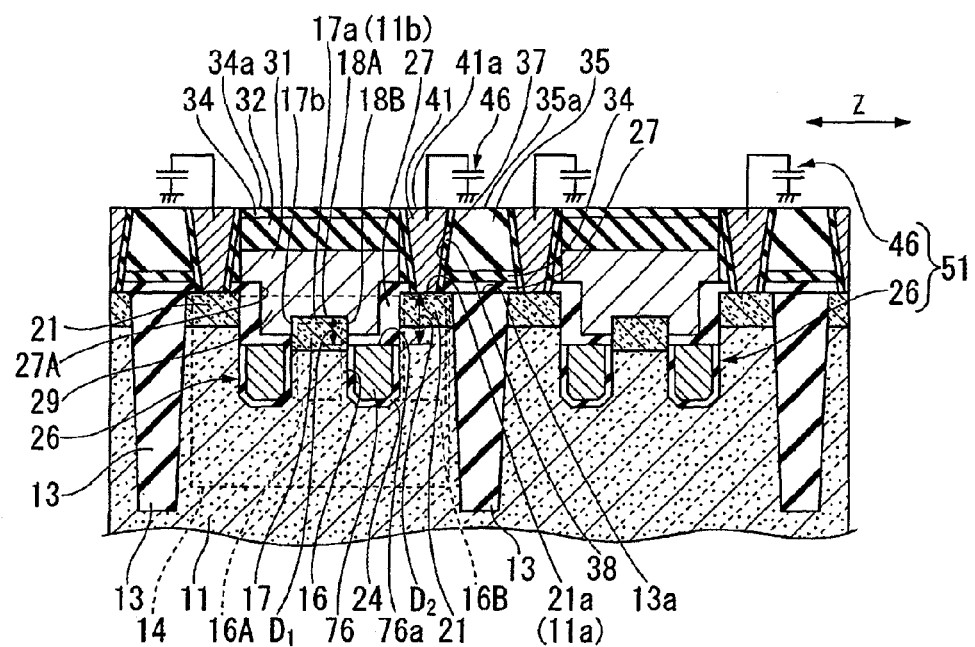
FIG. 14 is a cross-sectional view taken along line A-A of FIG. 13.
Figure 15:
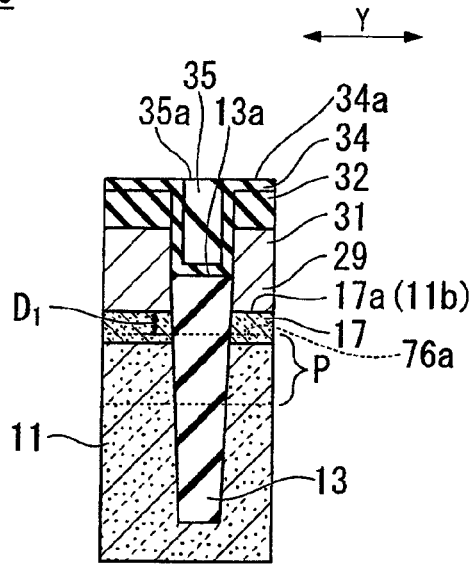
FIG. 15 is a cross-sectional view taken along line B-B of FIG. 13.
Figure 16:
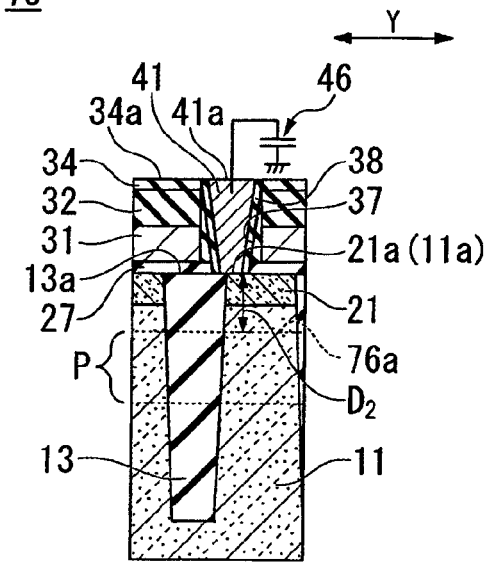
FIG. 16 is a cross-sectional view taken along line C-C of FIG. 13.

FIG. 14 is a cross-sectional view of the semiconductor device taken along line A-A of FIG. 13. FIG. 15 is a cross-sectional view of the semiconductor device taken along line B-B of FIG. 13. FIG. 16 is a cross-sectional view of the semiconductor device taken along line C-C of FIG. 13.

In FIG. 14, the same components as the components of the semiconductor device 10 illustrated in FIG. 2 and described in the first embodiment are denoted by the same reference numerals. In FIG. 15, the same components as the components of the structures illustrated in FIG. 11C and described in the first embodiment are denoted by the same reference numerals.

Figure 11D:
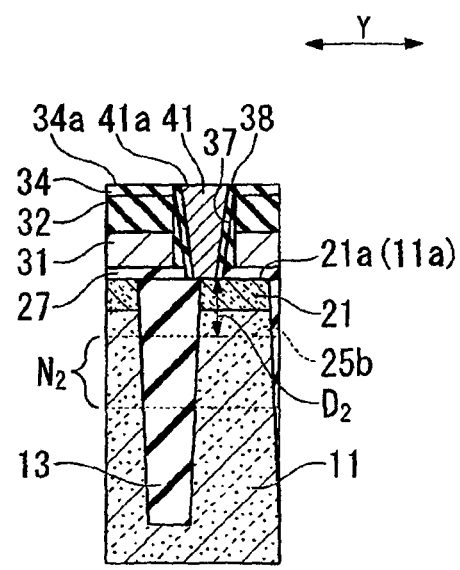
FIG. 11D is a cross-sectional view showing a primary portion of the memory cell array taken along line C-C of FIG. 11A.

In FIG. 16, the same components as the structures illustrated in FIG. 11D and described in the first embodiment are denoted by the same reference numerals. The reference sign P in FIGS. 15 and 16 represents the position of a gate electrode 76.

In FIGS. 14 to 16, some of the components of the semiconductor device 75 in the second embodiment, i.e., the capacitance contact pads 42, the silicon nitride films 44, the lower electrodes 47, the capacitance insulation film 48, the upper electrode 49, and the capacitance plate 52 shown in FIG. 2 are omitted from the illustration.

In the second embodiment, a DRAM will be described as an example of the semiconductor device 75.

The semiconductor device 75 (memory cell array) according to the second embodiment of the present invention will be described with reference to FIGS. 13 to 16. The semiconductor device 75 has a peripheral circuit area (including transistors for peripheral circuits and the like) that is arranged so as to surround a memory cell region. Such a peripheral circuit area is not illustrated in any of FIGS. 13 to 16.

Referring to FIGS. 13 to 16, the semiconductor device 75 according to the second embodiment of the present invention has gate electrodes 76 instead of the gate electrodes 25 provided in the semiconductor device 10 of the first embodiment (gate electrodes each having a step with upper surfaces 25a and 25b). A primary surface 11b of the semiconductor substrate 11 in the first lateral portion 16A is located at a position lower than a primary surface 11a of the semiconductor substrate 11 in the second lateral portion 16B. Other configurations are the same as those of the semiconductor device 10.

Each of the gate electrodes 76 is arranged in the groove 16 while the gate insulation film 24 is interposed between the gate electrode 76 and inner surfaces of the groove 16. Each of the gate electrodes 76 has a flattened upper surface 76a. In other words, each of the gate electrodes 76 has no step at the upper surface 76a.

The upper surfaces 76a of the gate electrodes 76 are located lower than the primary surface 11b of the semiconductor substrate 11 (the upper surfaces 17a of the first impurity diffusion regions 17) and the primary surface 11a of the semiconductor substrate 11 (the upper surfaces 21a of the second impurity diffusion regions 21).

The gate electrodes 76 are formed of the same material as that of the gate electrodes 25 of the first embodiment.

The first impurity diffusion regions 17 are formed underneath the primary surface 11b of the semiconductor substrate 11. The primary surface 11b of the semiconductor substrate 11 is located between the primary surface 11a of the semiconductor substrate 11 and the upper surfaces 76a of the gate electrodes 76.

The depth $D_2$ measured from the upper surfaces 21a of the second impurity diffusion regions 21 (the primary surface 11a of the semiconductor substrate 11) to the upper surfaces 76a of the gate electrodes 76 is set to be greater than the depth $D_1$ measured from the upper surfaces 17a of the first impurity diffusion regions 17 (the primary surface 11b of the semiconductor substrate 11) to the upper surfaces 76a of the gate electrodes 76.

Thus, distances from contact surfaces between contact plugs and the semiconductor substrate 11 to the channel region can be made asymmetric between the source region and the drain region in a field effect transistor having a buried gate electrode. Therefore, the flexibility of controlling the transistor characteristics can be improved.

According to a semiconductor device of the second embodiment, each of the gate electrodes 76 arranged within the grooves 16 has a flattened upper surface 76a. The primary surface 11b of the semiconductor substrate 11 underneath which the first impurity diffusion region 17 is formed (the upper surface 17a of the first impurity diffusion region 17) is located between the primary surface 11a of the semiconductor substrate 11 underneath which the second impurity diffusion region 21 is formed (the upper surface 21a of the second impurity diffusion region 21) and the upper surface 76a of the gate electrode 76. Thus, the depth $D_2$ of the upper surface 76a of the gate electrode 76 on the capacitance contact side is greater than the depth $D_1$ of the upper surface 76a of the gate electrode 76 on the bit contact side. Accordingly, the semiconductor device of the second embodiment can achieve the same advantageous effects as semiconductor device 10 of the first embodiment.

Specifically, the following advantages are brought by applying the structure described in the second embodiment to selection transistors of a DRAM. The $t_{REF}$ characteristics can be maintained by increasing the depth $D_2$ of the upper surface 76a of the gate electrode 76 on the capacitance contact side, where charges stored in a capacitor may possibly leak due to junction leakage. The $t_{WR}$ characteristics can be improved by reducing the depth $D_1$ of the upper surface 76a of the gate electrode 76 on the bit contact side, where no problem of leakage of charges arises.

The semiconductor device 75 having the above structure in the second embodiment can be manufactured by the same method as the manufacturing method of the semiconductor device 10 in the first embodiment, except that the step of forming a step with upper surfaces of the gate electrodes 25 in the manufacturing process of the semiconductor device of the first embodiment is replaced with a step of forming a primary surface 11b of the semiconductor substrate 11.

According to a semiconductor device of the present invention, distances from contact plugs (the first conductor and the second conductor) to a channel region can be made asymmetric between a source region and a drain region in a buried gate electrode type field effect transistor. Therefore, the flexibility of controlling the transistor characteristics can be improved.

Although preferred exemplary embodiments of the present invention have been described in detail, the present invention is not limited to those specific embodiments. It should be understood that various changes and modifications may be made therein without departing from the scope of the present invention defined by the appended claims.

What is claimed is:
1. A semiconductor device comprising:
  a semiconductor body including
    a first upper surface,
    a first side surface extending downwardly from the first upper surface,
    a second upper surface,
    a second side surface extending downwardly from the second upper surface, and
    a bottom surface interfacing the first and second side surfaces with each other,
    the first and second side surfaces and the bottom surface cooperating with one another to define a groove;
  a conductive film partially filling the groove with an intervention of an insulating film therebetween such that the conductive film terminates at a first intermediate portion of the first side surface between the first upper surface and the bottom surface and at a second intermediate portion of the second side surface between the second upper surface and the bottom surface,
  a first distance between the first intermediate portion of the first side surface and the first upper surface being greater than a second distance between the second intermediate portion of the second side surface and the second upper surface,
  the insulating film covering a portion of inner surfaces of the groove, said portion of inner surfaces of the groove corresponding to a gate electrode formation area, and
  the conductive film being a base material of a gate electrode formed in the gate electrode formation area;
  a first impurity diffusion region adjacent the first upper surface;
  a second impurity diffusion region adjacent the second upper surface; and
  an interlayer dielectric film over the gate electrode in the groove,
  wherein the gate electrode includes a first gate electrode upper surface, a second gate electrode upper surface, and a step between the first gate electrode upper surface and the second gate electrode upper surface,
  wherein the second impurity diffusion region does not overlap with the gate electrode, and
  wherein a top surface of at least a portion of the interlayer dielectric film is lower than a top surface of the first impurity diffusion region.
2. The device as claimed in claim 1, wherein the first and second upper surfaces are substantially coplanar with each other.

3. The device as claimed in claim 2, wherein the conductive film includes an uneven top surface to terminate at the first and second intermediate portions of the first and second side surfaces, respectively.

4. The device as claimed in claim 3, wherein the conductive film includes a stepwise top surface to terminate at the first and second intermediate portions of the first and second side surfaces, respectively.

5. The device as claimed in claim 1, further comprising:
a first conductor formed so as to be held in contact with the first upper surface and be electrically connected to the first impurity diffusion region; and
a second conductor formed so as to be held in contact with the second upper surface and be electrically connected to the second impurity diffusion region.

6. The device as claimed in claim 5, further comprising:
a plurality of field effect transistors each including the groove;
a capacitor electrically connected to the first conductor and allocated to each of the plurality of field effect transistors; and
a conductive wire electrically connected to the second conductor and shared among the plurality of field effect transistors.

7. The device as claimed in claim 1, wherein the interlayer dielectric film includes another portion having a top surface higher than the top surface of the first impurity diffusion region.

8. The device as claimed in claim 1, further comprising a bit contact plug over the interlayer dielectric film, the bit contact plug being in contact with the top surface and a side surface of the first impurity diffusion region.

9. A semiconductor device comprising:
a semiconductor body including
a first upper surface having a first edge,
a first side surface extending downwardly from the first upper surface,
a second upper surface having second and third edges,
a second side surface extending downwardly from the second edge of the second upper surface,
a first bottom surface interfacing the first and second side surfaces with each other,
a third side surface extending downwardly from the third edge of the second upper surface,
a third upper surface having a fourth edge,
a fourth side surface extending downwardly from the fourth edge of the third upper surface, and
a second bottom surface interfacing the third and fourth side surfaces with each other,
the first and second side surfaces and the first bottom surface cooperating with one another to define a first groove, the third and fourth side surfaces and the second bottom surface cooperating with one another to define a second groove;
a first conductive film partially filling the first groove with an intervention of a first insulating film therebetween such that the first conductive film terminates at a first intermediate portion of the first side surface between the first edge of the first upper surface and the first bottom surface and at a second intermediate portion of the second side surface between the second edge of the second upper surface and the first bottom surface,
a first distance between the first intermediate portion of the first side surface and the first edge of the first upper surface being greater than a second distance between the second intermediate portion of the second side surface and the second edge of the second upper surface,
the first insulating film covering a portion of inner surfaces of the first groove, said portion of inner surfaces of the first groove corresponding to a first gate electrode formation area, and
the first conductive film being a base material of a first gate electrode formed in the first gate electrode formation area;
a second conductive film partially filling the second groove with an intervention of a second insulating film therebetween such that the second conductive film terminates at a third intermediate portion of the third side surface between the third edge of the second upper surface and the second bottom surface and at a fourth intermediate portion of the fourth side surface between the fourth edge of the third upper surface and the second bottom surface, a third distance between the third intermediate portion of the third side surface and the third edge of the second upper surface being shorter than a fourth distance between the fourth intermediate portion of the fourth side surface and the fourth edge of the third upper surface,
a first impurity diffusion region adjacent the first upper surface;
a second impurity diffusion region adjacent the second upper surface;
a third impurity diffusion region adjacent the third upper surface; and
a first interlayer dielectric film over the first gate electrode in the first groove,
wherein the first gate electrode includes a first gate electrode upper surface, a second gate electrode upper surface, and a step between the first gate electrode upper surface and the second gate electrode upper surface,
wherein the second impurity diffusion region does not overlap with the first gate electrode, and
wherein a top surface of at least a portion of the first interlayer dielectric film is lower than a top surface of the first impurity diffusion region.

10. The device as claimed in claim 9, wherein the first, second and third upper surfaces are substantially coplanar with each other.

11. The device as claimed in claim 10,
wherein the first conductive film includes a first uneven top surface to terminate at the first and second intermediate portions of the first and second side surfaces, respectively, and
the second conductive film includes a second uneven top surface to terminate at the third and fourth intermediate portions of the third and fourth side surfaces, respectively.

12. The device as claimed in claim 11,
wherein the first conductive film includes a first stepwise top surface to terminate at the first and second intermediate portions of the first and second side surfaces, respectively, and
the second conductive film includes a second stepwise top surface to terminate at the third and fourth intermediate portions of the third and fourth side surfaces, respectively.

13. The device as claimed in claim 9, further comprising:
a first conductor formed so as to be held in contact with the first upper surface and be electrically connected to the first impurity diffusion region;

a second conductor formed so as to be held in contact with the second upper surface and be electrically connected to the second impurity diffusion region; and a third conductor formed so as to be held in contact with the third upper surface and be electrically connected to the third impurity diffusion region.

14. The device as claimed in claim 13, further comprising:

a plurality of field effect transistors each including the first or second groove;

a capacitor electrically connected to the first or third conductor and allocated to each of the plurality of field effect transistors; and a conductive wire electrically connected to the second conductor and shared among the plurality of field effect transistors.

15. The device as claimed in claim 9, wherein the first interlayer dielectric film includes another portion having a top surface higher than the top surface of the first impurity diffusion region.

16. The device as claimed in claim 9, further comprising a first bit contact plug over the first interlayer dielectric film, the first bit contact plug being in contact with the top surface and a side surface of the first impurity diffusion region.

* * * * *